United States Patent [19]

Okutsu et al.

[11] Patent Number: 5,408,296
[45] Date of Patent: Apr. 18, 1995

[54] COLOR PROOF MAKING APPARATUS

[75] Inventors: Hirokazu Okutsu, Kanagawa; Mineo Ohta, Tokyo; Hirotaka Matsumoto, Shizuoka, all of Japan

[73] Assignee: Fuji Photo Film Co., Ltd., Kanagawa, Japan

[21] Appl. No.: 872,181

[22] Filed: Apr. 22, 1992

[30] Foreign Application Priority Data

| Apr. 23, 1991 | [JP] | Japan | 3-092335 |
|---|---|---|---|
| Apr. 24, 1991 | [JP] | Japan | 3-093904 |
| Apr. 24, 1991 | [JP] | Japan | 3-093905 |
| Apr. 24, 1991 | [JP] | Japan | 3-094410 |
| Apr. 24, 1991 | [JP] | Japan | 3-094411 |
| Nov. 15, 1991 | [JP] | Japan | 3-300625 |

[51] Int. Cl.⁶ .............................................. G03B 27/32
[52] U.S. Cl. ........................................ 355/32; 355/38; 355/27
[58] Field of Search .................. 355/32, 35, 38, 77, 355/83, 88, 32 LM; 358/76, 80

[56] References Cited

U.S. PATENT DOCUMENTS

| 3,834,813 | 9/1974 | White, Jr. | 355/77 X |
|---|---|---|---|
| 4,249,807 | 2/1981 | Webster | 354/4 |
| 4,416,522 | 11/1983 | Webster | 354/4 |
| 4,803,523 | 2/1989 | Pearson | 355/32 |
| 4,809,049 | 2/1989 | Okuzawa et al. | 355/28 |
| 4,901,104 | 2/1990 | Sakakibara | 355/32 |
| 4,924,261 | 5/1990 | Okino | 355/35 |
| 4,943,827 | 7/1990 | Good et al. | 355/77 X |
| 4,945,382 | 7/1990 | Yui et al. | 355/27 |
| 4,952,969 | 8/1990 | Hara | 355/27 |
| 5,001,511 | 3/1991 | Katoh et al. | 355/27 |
| 5,019,484 | 5/1991 | Shimaoka et al. | 355/88 |
| 5,028,963 | 7/1991 | Ohashi et al. | 355/27 |
| 5,057,861 | 10/1991 | Maeda et al. | 355/27 |
| 5,078,497 | 1/1992 | Borton et al. | 356/446 |
| 5,177,532 | 1/1993 | Takagi | 355/214 |
| 5,288,586 | 2/1994 | Yamaguchi | 355/88 X |

FOREIGN PATENT DOCUMENTS

| 52-89915 | 7/1977 | Japan . |
|---|---|---|
| 61-123838 | 6/1986 | Japan . |
| 1-196065 | 8/1989 | Japan . |
| 1-196066 | 8/1989 | Japan . |
| 1-224930 | 9/1989 | Japan . |
| 2-19710 | 1/1990 | Japan . |

Primary Examiner—D. Rutledge
Attorney, Agent, or Firm—Sughrue, Mion, Zinn Macpeak & Seas

[57] ABSTRACT

A color proof making apparatus for making a color proof for forming a color image having a dye image by exposing an ultraviolet light-sensitive material to ultraviolet light through an image original, and by heating the exposed material. The apparatus includes a plurality of filters disposed in correspondence with different light-sensitive wavelength regions of the light-sensitive material and respectively adapted to transmit therethrough only the ultraviolet light of corresponding wavelength regions for exposing the light-sensitive material sensitive to the light-sensitive wavelength regions; a selecting device for selecting one of the filters which corresponds to each image original; and a driving unit for inserting the filter selected by the selecting device into an optical path leading to the image original. Accordingly, the filter is inserted accurately into the optical path, and it is possible to make a color proof with excellent color separation and high definition with a simple process.

25 Claims, 21 Drawing Sheets

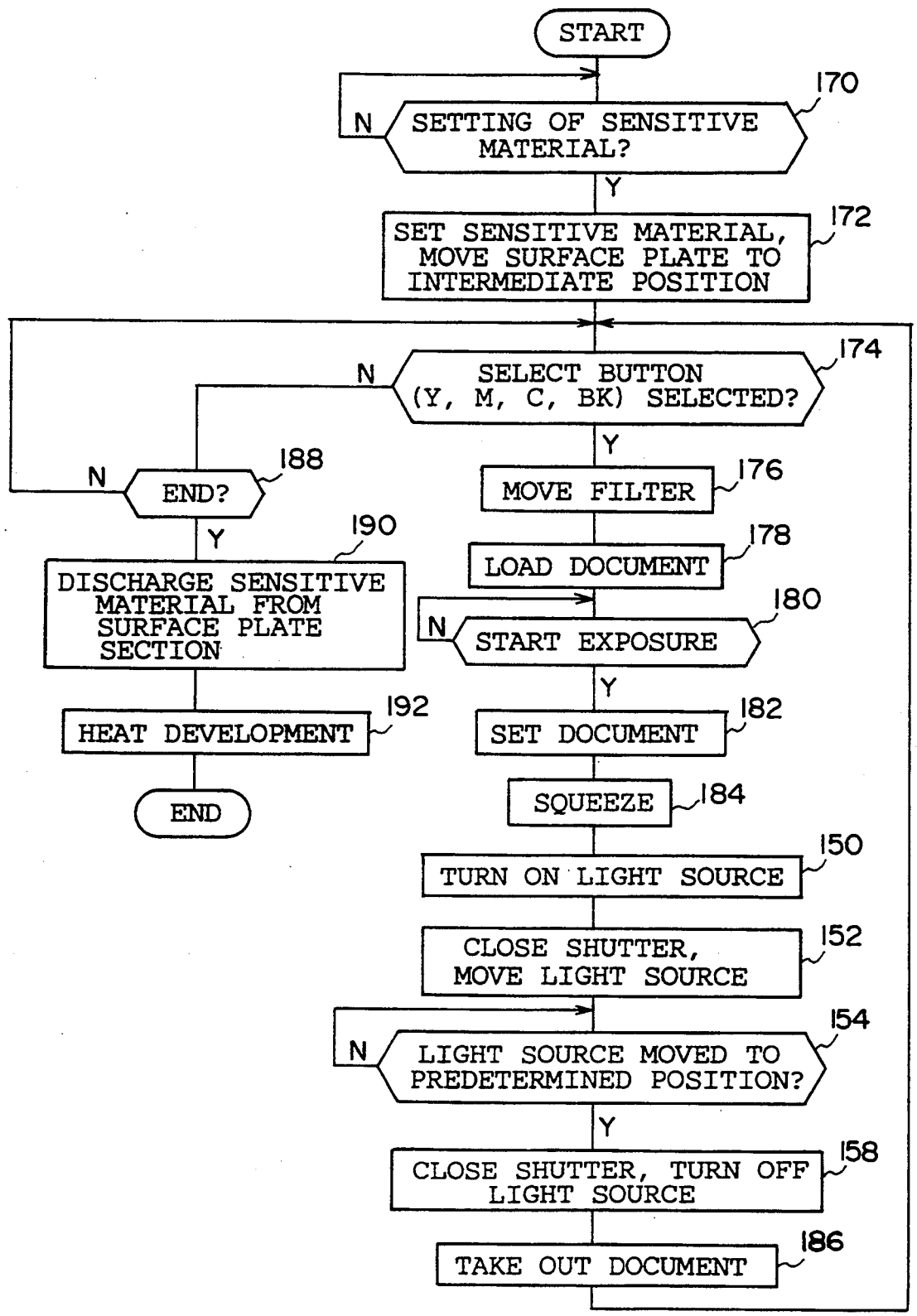

COLOR PROOF MAKING APPARATUS

BACKGROUND OF THE INVENTION

1. Field of the Invention

The present invention relates to a color proof making apparatus, and more particularly to a color proof making apparatus for making a color proof used for checking the quality of color prints by means of an ultraviolet light-sensitive material.

2. Description of the Related Art

In effecting color printing in large volumes by using a printing machine, e.g., in the printing of color advertisements (so-called inserts) inserted in newspapers or the like, the printing quality is checked in advance by using a color proof making apparatus before printing is actually effected by the printing machine.

An overlay system is known as a typical system of the color proof making apparatus. This is a system in which an image is reproduced by superposing films of various color-material films on top of another, and it is practically impossible to view the image transmitted through the films, and the image thus obtained is very poor in quality.

Also, another system called a surprint system is known as a system for obtaining an image on a sheet. This is a system in which an image is obtained by successively superposing light-sensitive films of four colors on a substrate one on top of each other. In this system, such products as Cromalin (made by DuPont; product name), Matchprint (made by 3M Co.; product name), and COLOR-ART (made by Fuji Photo Film Co., Ltd.; product name) are known. In each of these systems, four light-sensitive films are necessary, and scraps are produced.

A color paper system is known as another system for forming a color image on a light-sensitive sheet. In this system, an original film is brought into close contact with a color paper, and is subjected to exposure by using filters of various colors, and is then subjected to wet development to obtain a color image. FINE CHECKER (made by Fuji Photo Film Co., Ltd.; product name) and Konsensus (made by Konica Corp.; product name) are known as examples of this system. In this system, since the sensitivity area of the color paper is a visible area, a dark room or an exposing apparatus equipped with a dark room is necessary for handling the same, and it is necessary to maintain ad manage a developing solution.

In each of these systems, however, any of the following drawbacks is experienced: A plurality of sheets are required; scraps of such as transfer sheets and a toner are produced; handling in the dark room is difficult; and a development system in which a developing solution is used is necessary. As a result, there has been demand for overcoming these drawbacks.

Accordingly, it is conceivable to use an ultraviolet light-sensitive material which does not produce scraps and is not sensitive to a visible region which facilitates handling in a dark room. As such light-sensitive materials, the following materials have been proposed: one in which a two-component type heat-sensitive coloring medium is arranged such that two components thereof are spaced away from each other with microcapsules containing a photosetting composition interposed therebetween (Japanese Patent Application Laid-Open No. 89915/1977); one in which a layer containing both a vinyl monomer having a basic Group and a photopolymerizing composition, a separating layer, and a layer containing an electron-donating colorless dye are superposed one on top of another (Japanese Patent Application Laid-Open Nos. 123838/19860; and those in which a plurality of light-sensitive layers emitting different colors are provided, and the respective light-sensitive layers have a central wavelength (Japanese Patent Application Laid-Open Nos. 224930/1989 and 19710/1990). If the aforementioned light-sensitive materials are used, it is possible to form a visible image by forming a latent image on the photo-setting composition through exposure and by subsequently heating the same.

If this ultraviolet light-sensitive material is used, processing in a bright room is possible, and scraps are not produced. To make a color proof by using this ultraviolet light-sensitive material, it is necessary to apply light of a wavelength region corresponding to a light-sensitive wavelength region in which the light-sensitive material undergoes color development, by using a light source for emitting ultraviolet light.

SUMMARY OF THE INVENTION

In view of the above-described circumstances, it is an object of the present invention to provide a color proof making apparatus which is capable of making a color proof in a bright room by applying ultraviolet light to a light-sensitive material, and which is capable of making a color proof with excellent color separation and high definition.

Another object of the present invention is to provide a color proof making apparatus capable of reliably integrating a quantity of light emitted from a light source and of preventing a decline in the quality of an exposed image due to underexposure.

Still another object of the present invention is to provide a color proof making apparatus in which the operating efficiency in the assembly of interference filters is improved, each of which is inserted between a light-sensitive material and an image original so that ultraviolet light of a specific ultraviolet wavelength region in the ultraviolet light from a light source will be selectively made incident upon the light-sensitive material via the image original.

A further object of the present invention is to provide a color proof making apparatus in which the efficiency of an exposing operation is improved.

In accordance with a first aspect of the present invention, there is provided a color proof making apparatus for making a color proof for forming a color image by exposing an ultraviolet light-sensitive material to light of an ultraviolet wavelength region through an image original, and by heating the exposed ultraviolet light-sensitive material, comprising: a light source for emitting the light of the ultraviolet wavelength region; an interference filter disposed between the light source and the image original; and light-quantity integrating means for integrating the quantity of light from the light source and disposed in such a manner that at least a light-receiving portion thereof is located in an optical path between the interference filter and the light source.

In accordance with the first aspect of the invention arranged as described above, the light-receiving portion of the light-quantity integrating means is inserted in the optical path between the interference filter and the light source. Accordingly, it is possible to reliably integrate the quantity of light before the light is made incident upon the interference filter after being emitted from the light source. For this reason, even if a microwave-powered light source is used as the light source, and the quantity of light is declined due to the deterioration of the microwave-powered light source, it is possible to radiate a necessary quantity of light to the light-sensitive material, so that it is possible to prevent a decline in the quality of the image due to underexposure.

The light-quantity integrating means may include a light transmitting cable having an end portion constituting the light-receiving portion and another end portion located outside the optical path and constituting a light-fetching portion, and a light-quantity integrating meter for integrating the quantity of light from the light source by receiving the light from the light-fetching portion.

The light-quantity integrating means may include light reflecting means constituting the light-receiving portion and adapted to reflect part of the light from the light source to outside the optical path, and a light-quantity integrating meter for integrating the quantity of light from the light source by receiving the light reflected from the light reflecting means.

The color proof making apparatus in accordance with a second aspect of the invention comprises: an exposing section having a light source for exposing a light-sensitive material by radiating light to the light-sensitive material via an image original superposed on the light-sensitive material; a cover for covering the exposing section from the light-sensitive material side; and sucking means for sucking the light-sensitive material onto the cover.

In the above-described aspect, the sucking means for causing the light-sensitive material to be sucked onto the cover is provided. Accordingly, once the light-sensitive material which has been positioned is sucked onto the surface of the cover by means of this sucking means, when the image original is replaced, the operator is capable of the light-sensitive material integrally with the cover from the image original by opening the cover. In addition, since the operator is capable of easily positioning the light-sensitive on the image original by closing the cover after replacing the image original, the efficiency of the exposing operation can be improved.

In addition, in this aspect, a light source for emitting ultraviolet light may be used as the light source, and ultraviolet-light-sensitive heat-developable material may be used as the light-sensitive material.

Furthermore, in this aspect, means for maintaining a relative positional relationship between the cover and the exposing section may be provided.

In accordance with a third aspect of the invention, there is provided a color proof making apparatus for making a color proof for forming a color image having a dye image by exposing an ultraviolet light-sensitive material to light of an ultraviolet wavelength region through an image original, and by heating the exposed material, comprising: a light source for radiating the light of the ultraviolet wavelength region to the image original; and a filter unit in which a plurality of filters are disposed in correspondence with mutually different light-sensitive wavelength regions of the light-sensitive material, the plurality of filters being capable of respectively transmitting therethrough the light of corresponding ultraviolet wavelength regions for exposing the light-sensitive material sensitive to the ultraviolet wavelength regions, and the plurality of filters being capable of being moved into or away from an optical path between the light source and the image original.

In this aspect, the filter unit is provided with the plurality of filters being capable of respectively transmitting therethrough the light of corresponding ultraviolet wavelength regions for exposing the light-sensitive material sensitive to the ultraviolet wavelength regions. Accordingly, the plurality of filters can be assembled to the color proof making apparatus simultaneously. For this reason, in a case where interference filters are used as the filters, the efficiency in the operation of assembling the filters and in the filter replacing operation can be improved.

In addition, the filter unit may be further provided with a light-reducing filter for reducing a quantity of light emitted from the light source and applied to the image original. By providing this light-reducing filter, the color proof making apparatus in accordance with this aspect can be used in the exposure of high-sensitivity light-sensitive material used for purposes other than the color proof making operation.

In accordance with a fourth aspect of the invention, there is provided a color proof making apparatus for making a color proof for forming a color image having a dye image by exposing an ultraviolet light-sensitive material to ultraviolet light of an ultraviolet wavelength region through an image original, and by heating the exposed material, comprising: a light source for radiating the ultraviolet light; a plurality of filters disposed in correspondence with mutually different light-sensitive wavelength regions of the ultraviolet light, the plurality of filters being capable of respectively transmitting therethrough the ultraviolet light of corresponding ultraviolet wavelength regions; selecting means for selecting one filter from the plurality of filters in correspondence with an identification code provided on the image original for specifying a type of the image original; and filter driving means for inserting the filter selected by the selecting means into an optical path between the light source and the light-sensitive material.

In the color proof making apparatus in accordance with this aspect, the image original is provided with an identification code for specifying its type. A filter corresponding to the identification code is selected from the plurality of filters by the selecting means. The filter driving means inserts the filter selected by the selecting means into the optical path between the light source and the light-sensitive material. Accordingly, since the filter is selected in correspondence with the type of image original, exposure can be effected without requiring time and trouble in replacing the filter which differs each time the image original is replaced. Hence, a satisfactory image can be obtained without causing a decline in the operating efficiency.

The color proof making apparatus in accordance with this aspect may further comprise control means for controlling a quantity of light radiated to the light-sensitive material via the image original in correspondence with a specified type of the image original.

Since this control means controls the quantity of light to be applied to the ultraviolet light-sensitive material in correspondence with the specified type of image original, the quantity of ultraviolet light applied to the light-sensitive material becomes an appropriate level. Thus, the ultraviolet light of a quantity of light corresponding to the specified image original is applied to the light-sensitive material after being transmitted through an appropriate filter selected, the time and trouble required in replacing the filter with a different filter on each occasion of replacement of the image original and in setting the exposure amount corresponding to the specified image original can be saved. Thus, exposure can be effected with an appropriate exposure amount and with the ultraviolet light of an appropriate ultraviolet wavelength region. Hence, a satisfactory image can be obtained without causing a decline in the operational efficiency.

In this aspect, interference filters can be used as the plurality of filters. Since these interference filters can be fabricated easily in such a manner that the half-width of the light transmitted therethrough falls in a predetermined wavelength region, the wavelength region of the ultraviolet light to be applied to the light-sensitive material can be readily set to an ultraviolet wavelength region for forming a dye image corresponding to the type of image original. For this reason, the ultraviolet light can be applied efficiently to the light-sensitive material in such a manner as to form a desired dye image by means of the interference filter corresponding to the type of image original. Thus, exposure can be effected with the ultraviolet light of an appropriate ultraviolet wavelength region.

In addition, the color proof making apparatus in accordance with this fourth aspect of the invention may further comprise: detecting means for detecting the identification code; and control means for controlling the selecting means so as to select the filter on the basis of a detection signal outputted from the detecting means, and for controlling the filter driving means in such a manner that the filter is inserted into the optical path between the light source and the light-sensitive material. In this case, the identification code of the image original is detected by the detecting means to specify the type of that image original, and the control means controls the selecting means in such a manner as to select a filter corresponding to this specified type of image original, and the selected filter is inserted into the optical path between the light source and the light-sensitive material. Accordingly, an erroneous filter is prevented from being selected with respect to the image original used for the exposed. The ultraviolet light of an ultraviolet wavelength region corresponding to the image original, or the ultraviolet light of an appropriate ultraviolet wavelength region and of an exposure amount corresponding to the type of the image original is applied to the light-sensitive material. Thus, a satisfactory image can be obtained without causing a decline in the operating efficiency.

In accordance with a fifth aspect of the invention, there is provided a color proof making apparatus for making a color proof for forming a color image having a dye image by exposing an ultraviolet light-sensitive material to ultraviolet light through an image original, and by heating the exposed material, comprising: a microwave-powered light source for emitting the ultraviolet light; at least three filters disposed in correspondence with at least three different light-sensitive wavelength regions of the light-sensitive material, the filters being capable of respectively transmitting therethrough the ultraviolet light of corresponding ultraviolet wavelength regions, and the filters being capable of being inserted into an optical path between the microwave-powered light source and the image original; at least one heat insulating filter disposed in such a manner as to be located in the optical path between the microwave-powered light source and a position where the filters are inserted; and control means for effecting control such that the light-sensitive material is exposed by the microwave-powered light source by consecutively inserting the filters into the optical path.

In the color proof making apparatus in accordance with this aspect, at least three filters are capable of being inserted into the optical path between the light source and the light-sensitive material, in correspondence with at least three different light-sensitive wavelength regions of the light-sensitive material. These filters allow the ultraviolet light of corresponding ultraviolet wavelength regions to be transmitted therethrough. A heat-insulating filter is provided between the microwave-powered light source and the position where the filters are inserted, so as to prevent the temperature rise or discoloration of the filters. By means of the control means, the at least three filters are consecutively inserted into the optical path, and the ultraviolet light of respectively corresponding ultraviolet wavelength regions in the ultraviolet light from the microwave-powered light source is transmitted through the image original via the inserted filter. By means of this transmitted ultraviolet light, the light-sensitive material is irradiated and is exposed. Subsequently, the exposed light-sensitive material is heated and developed. As a result, a dye image corresponding to at least three light-sensitive wavelength regions is formed on the light-sensitive material, thereby making a color proof. As a result, the color proof can be made in a bright room.

The at least three filters used in this aspect may be interference filters, respectively. By using these interference filters, it is possible to set the wavelength region of the transmitted light to one having a narrow half-width. For this reason, only the light-sensitive layer of one light-sensitive wavelength region of the light-sensitive material can be exposed, and the remaining light-sensitive layers of the other light-sensitive wavelength regions of the light-sensitive material are not exposed. Hence, it is possible to obtain a color proof with excellent color separation.

In accordance with a sixth aspect of the invention, there is provided a color proof making apparatus for making a color proof for forming a color image having a dye image by exposing an ultraviolet light-sensitive material to ultraviolet light through an image original, and by heating the exposed material, comprising: at least three light sources disposed in correspondence with at least three different light-sensitive wavelength regions of the light-sensitive material, the light sources being respectively adapted to emit the ultraviolet light-sensitive of corresponding ultraviolet wavelength regions for exposing the light-sensitive material sensitive to the ultraviolet wavelength regions; and control means for effecting control such that the at least three light sources are turned on separately or simultaneously to expose the light-sensitive material.

In this aspect, at least three light sources for emitting the ultraviolet light of different ultraviolet wavelength regions are used as the light sources. Here, the at least three light sources are separately or simultaneously turned on by the control means. As a result, at least three light-sensitive wavelength regions of the light-sensitive material are exposed, and the light-sensitive material is subsequently heated to allow the dye image to be formed thereon. A color proof is made in the above-described manner. Hence, it is possible to make a color proof in a bright room.

In accordance with a seventh aspect of the invention, there is provided a color proof making apparatus for making a color proof for forming a color image having a dye image by exposing an ultraviolet light-sensitive material to ultraviolet light through an image original, and by heating the exposed material, comprising: a linear light source for radiating the ultraviolet light to the ultraviolet light-sensitive material; moving means for causing the ultraviolet light-sensitive material and the image original on the one hand, and the light source on the other, to move relative to each other; optical means for converting the ultraviolet light from the light source to parallel rays of light; and selecting means for selecting the ultraviolet light of a light-sensitive wavelength region radiated from the light source and corresponding to the image original.

In the color proof making apparatus in accordance with this aspect, the ultraviolet light from the light source is converted to parallel rays of light. In addition, the ultraviolet light selecting means selects the ultraviolet light corresponding to the image original to allow that light to be radiated to the light-sensitive material. As a result, the light-sensitive material is irradiated with the ultraviolet light corresponding to the image original via the image original so as to be subjected to exposure. In a case where separate light sources are provided in correspondence with the ultraviolet light-sensitive regions of the light-sensitive material, i.e., in correspondence with the plurality of image originals, an appropriate one of the light sources is selected by the ultraviolet light selecting means.

In addition, in this color proof making apparatus, a linear light source, such as a fluorescent lamp, may be used as the light source. The fluorescent lamp generates a small amount of heat, so that even if the heat-developable light-sensitive material is used, the light-sensitive material is prevented from being heated by the heat from the light source.

This linear light source on the one hand, and the ultraviolet light-sensitive material and the image original on the other, are subjected to undergo relative movement so as to effect exposure. That is, the linear light source may be moved by a moving means, or the ultraviolet light-sensitive material and the image original may be moved.

Furthermore, the light source may be comprised of a combination of a plurality of light sources, or the light source may be one in which the ultraviolet light emitted from the single light source corresponds to the entire light-sensitive region of the light-sensitive material. In addition, the ultraviolet light selecting means causes only the ultraviolet light corresponding to a light-sensitive wavelength region of the light-sensitive material to be applied to the light-sensitive material.

In this embodiment, an arrangement may be provided such that filters which are each inserted into the optical path between the light source and the ultraviolet light-sensitive material is provided as the ultraviolet light selecting means, and the ultraviolet light of an ultraviolet wavelength region corresponding to the image original is selected by the filter from the ultraviolet light transmitted through the optical means.

That is, the ultraviolet light from the light source can be selectively fetched by the filter. A filter corresponding to the image original is disposed between the optical means and the light-sensitive material, and as the filter is moved into or away from the optical path, the ultraviolet light corresponding to the light-sensitive wavelength region of the light-sensitive material can be selected and radiated to the light-sensitive material. The light from the light source is collimated into parallel rays of light, and is directed to the light-sensitive material. At the same time, the ultraviolet light of a ultraviolet wavelength region corresponding to the light-sensitive wavelength region of the light-sensitive material is selected in correspondence with the image original by means of the filter and is transmitted therethrough, and the light-sensitive material is exposed via the image original. Since the ultraviolet is applied the light-sensitive material orthogonally to its light-sensitive surface, even if an image original on which an image is formed is placed on an upper surface of the light-sensitive material, the ultraviolet light is transmitted through that image original without being refracted, and exposes the light-sensitive material. As a result, the image formed on the light-sensitive material has high definition, and it is possible to make a color proof with excellent color separation.

Interference filters may be used as the filters serving as the ultraviolet light selecting means, but dye filters may alternatively be used. Also, an arrangement may be provided such that a plurality of light sources and a plurality of filters are provided, and the ultraviolet light corresponding to the image original is fetched by means of a combination thereof, so as to expose the light-sensitive material.

In the above-described fifth to seventh aspects, it is sufficient for the light source to be disposed in such a manner that the light emitted therefrom is transmitted through the image original exposes the light-sensitive material. Specifically, the light source may be disposed above or below the image original so as to expose the light-sensitive material via the image original.

The other objects, features and advantages of the present invention will become more apparent from the following detailed description of the invention when read in conjunction with the accompanying drawings.

BRIEF DESCRIPTION OF THE DRAWINGS

FIG. 21 is a flowchart for controlling the color proof making apparatus in accordance with the present invention.

DESCRIPTION OF THE PREFERRED EMBODIMENTS

First Embodiment

Referring now to FIGS. 1 to 6, a detailed description will be given of a first embodiment of the present invention.

Figure 1:
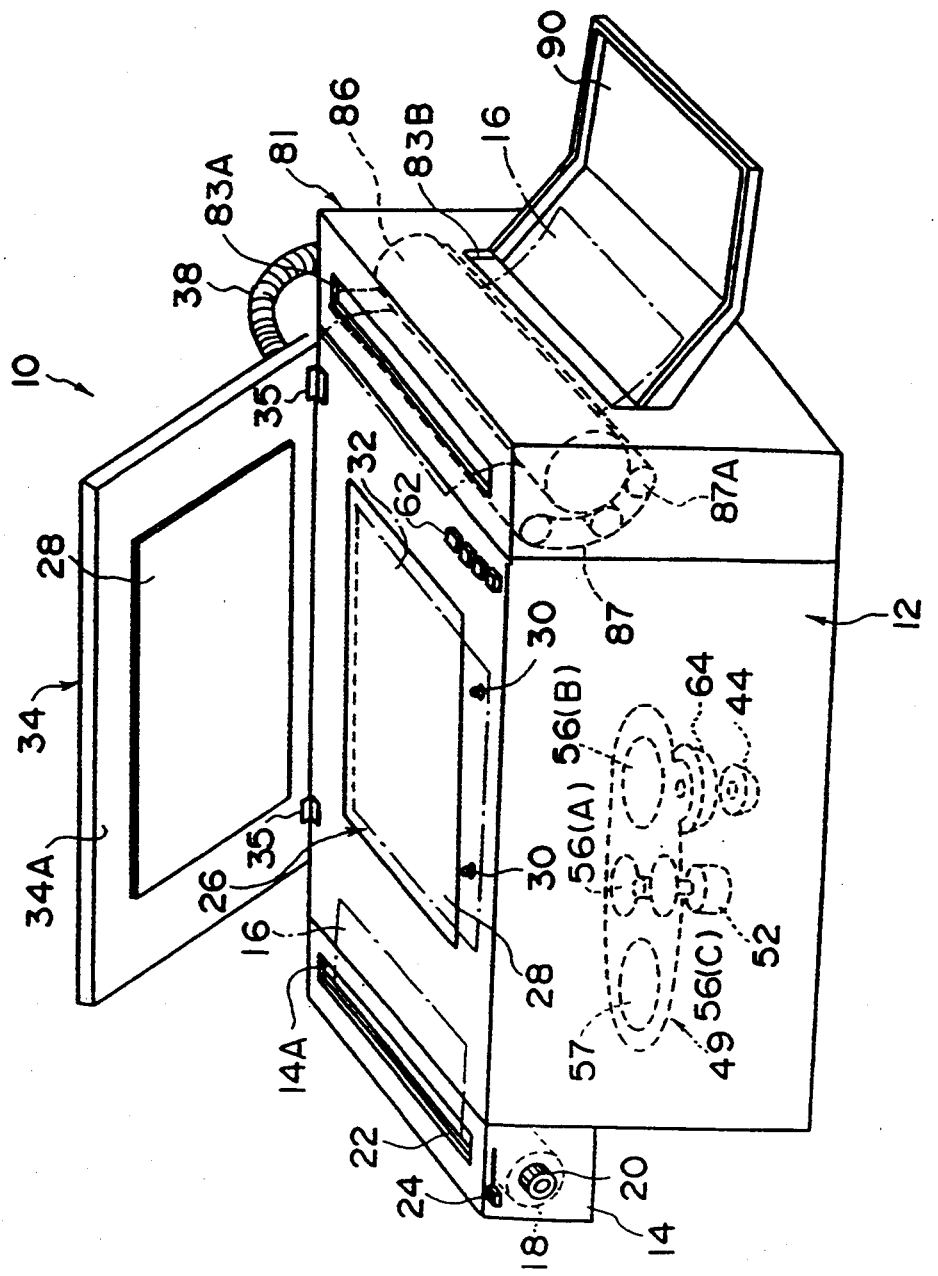
FIG. 1 is a perspective view of a color proof making apparatus in accordance with a first embodiment of the present invention.

A color proof making apparatus 10 shown in FIG. 1 is an apparatus for making a color proof which is used for checking any error in the layout, color, characters, and the like of original films before actual printing is effected by using the original films color-separated into a yellow (Y) plate, a magenta (M) plate, a cyan (C) plate, and a black (BK) plate. To obtain a color proof, each of the original films is positioned and superposed one at a time on an ultraviolet light-sensitive material, and the ultraviolet light-sensitive material is consecutively subjected to multiple contact exposure and is then subjected to heat development, thereby obtaining a color proof.

A sensitive-material-roll accommodating section 14 is disposed in a left-hand upper portion, as viewed in FIG. 1, of a casing 12 of the color proof making apparatus 10. A magazine 18 accommodating a light-sensitive material 16 therein is loaded in the sensitive-material-roll accommodating section 14. An opening 14A is formed in an upper surface of the sensitive-material-roll accommodating section 14.

A rotating knob 20 is provided on a front surface of the sensitive-material-roll accommodating section 14, and the light-sensitive material 16 is fed out through the opening 14A as this rotating knob 20 is rotated clockwise. A cutter 22 is provided in the opening 14A of the sensitive-material-roll accommodating section 14. This cutter 22 is interlocked with a slide knob 24 disposed on the front surface of the sensitive-material-roll accommodating section 14 at an upper portion thereof, and the cutter 22 is adapted to cut the light-sensitive material 16 by operating the slide knob 24. Accordingly, the operator is capable of cutting the light-sensitive material 16 drawn out from the sensitive-material-roll accommodating section 14 to a predetermined length by means of the cutter 22.

An exposing section 26 is disposed in a substantially central portion of an upper surface of the casing 12. A rectangular opening is formed in this exposing section 26, and transparent sheet glass 28 is disposed in this opening. A pair of positioning pins 30 are disposed upright on this side, as viewed in the drawing, of the exposing section 26 on the casing 12. As these positioning pins 30 are inserted through positioning holes formed in an edge of each of original films 32, including the color-separated Y plate, M plate, C plate, and BK plate, the positioning of the original films 32 can be effected easily and accurately.

The exposing section 26 is covered by an upper cover 34. This upper cover 34 is mounted on the casing 12 by means of a pair of hinges 35, and the upper cover 34 is singable about the hinges 35.

Figure 2:
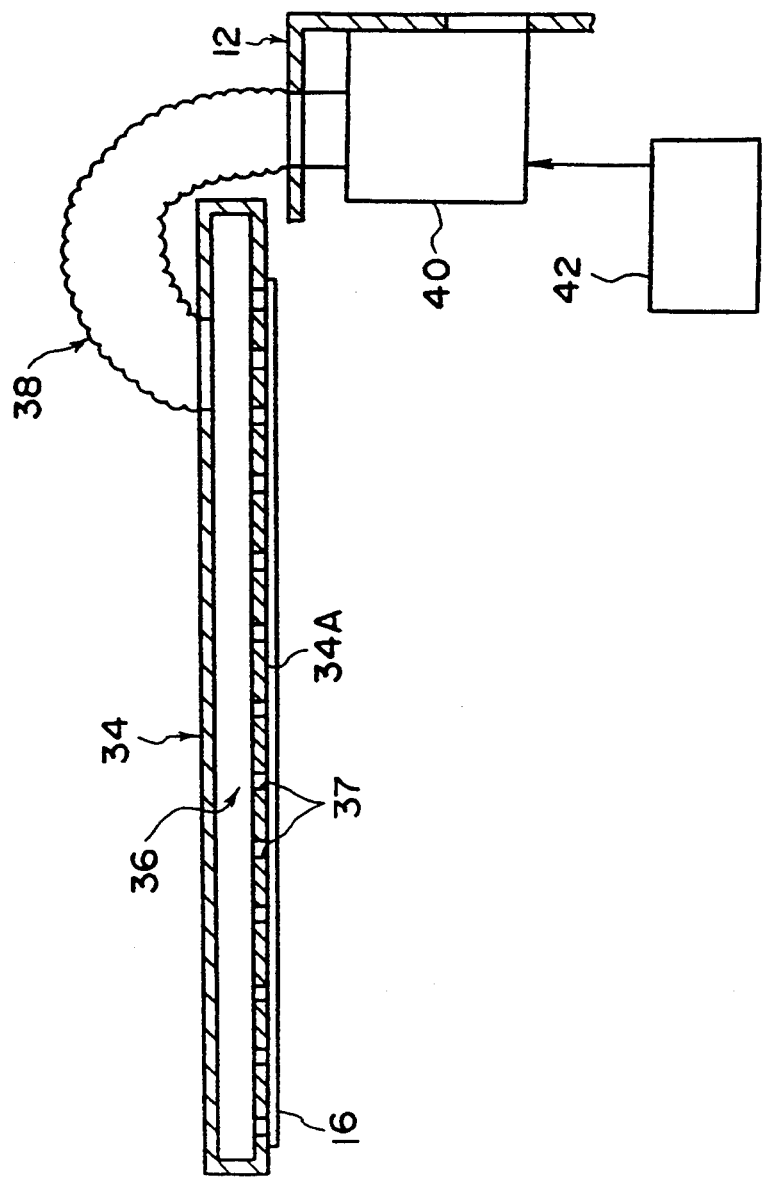
FIG. 2 is a side cross-sectional view of an upper cover of the color proof making apparatus in accordance with the first embodiment.

As shown in FIG. 2, the upper cover 34 is formed in the shape of a box having an internal space 36, and a suction pipe 38 is connected thereto. This suction pipe 38 is connected to a suction pump 40 disposed inside the casing 12. This suction pump 40 is connected to a controller 42 disposed inside the casing 12, and is subjected to on-off control by the controller 42. Accordingly, when the suction pump 40 is actuated, air in the internal space 36 in the upper cover 34 is sucked by means of the suction pipe 38, thereby reducing the pressure within the internal space 36.

A surface (pressing surface) 34A of the upper cover 34 for pressing the light-sensitive material 16 is provided with a plurality of small holes 37, through which the light-sensitive material 16 is sucked by the pressing surface 34A when the pressure within the internal space 36 in the upper cover 34 is reduced.

Figure 3:
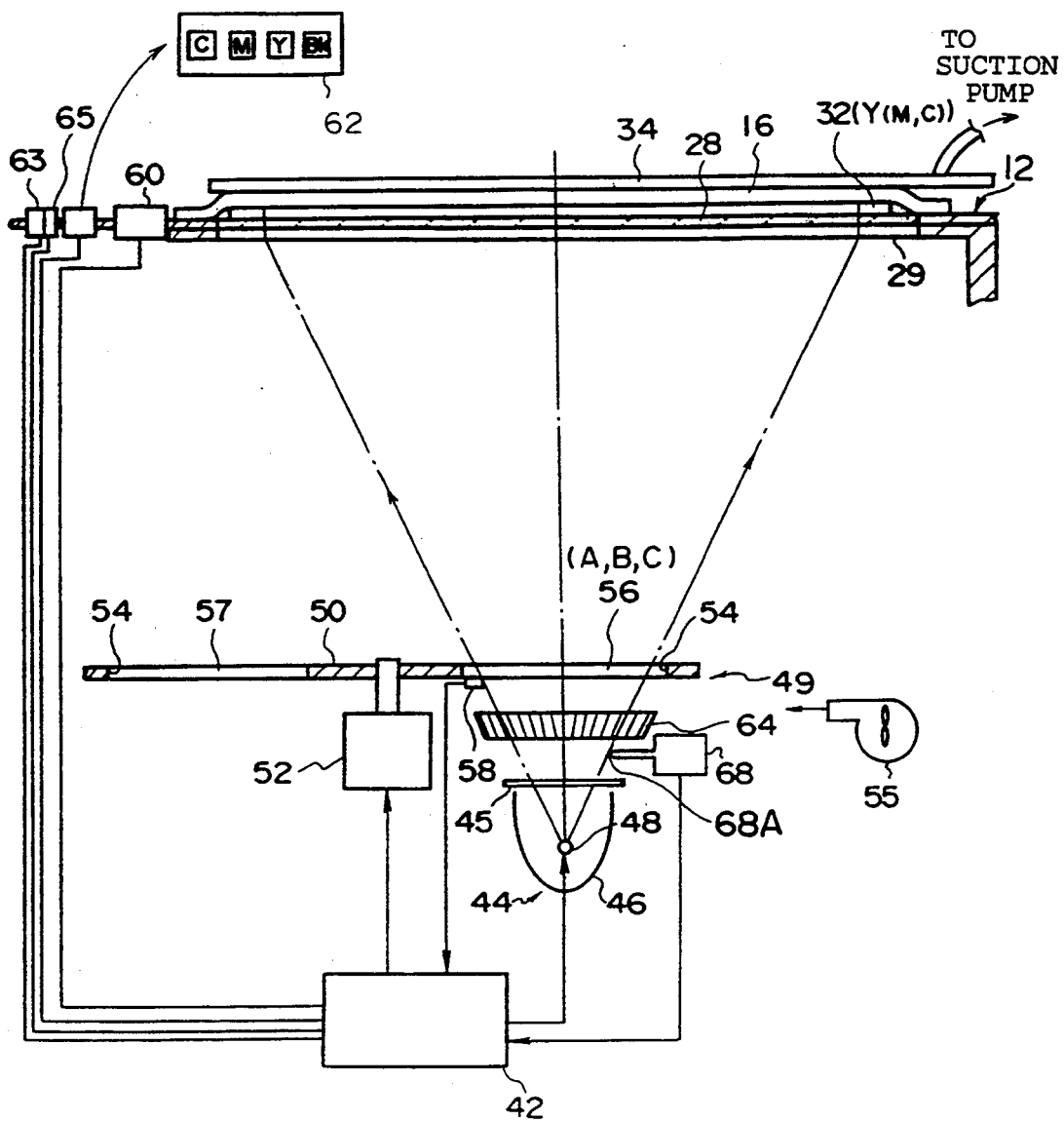
FIG. 3 is a schematic cross-sectional view of an exposing section of the color proof making apparatus in accordance with the first embodiment.

As shown in FIG. 3, a Fresnel lens 29 is disposed in close contact with a lower surface of the sheet glass 28 inside the casing 12, and is adapted to allow parallel rays to be applied to the light-sensitive material 16 via each original film 32. FIG. 3 shows an example of exposing the light-sensitive material 16 of a negative type, in which case the original films 32 including the Y plate, M plate, C plate, and BK plate are consecutively superposed on the sheet glass 28, and images on them are printed one by one onto the light-sensitive material 16 four times in total. In a case where the light-sensitive material 16 of a positive type is exposed, the BK plate is superposed on each of the Y plate, M plate, and C plate in such a manner that the BK plate is set on the light source side, and by using each of these superposed assemblies, printing is effected three times in total. In addition, grooves are formed in the vicinity of edges of the sheet glass 28 so as to eliminate a layer of air between the light-sensitive material 16 and the original film 32 and a layer of air between the sheet glass 28 and the original film 32 through sucking by the suction pump or the like during exposure. As a result, the light-sensitive material 16, the original film 32, and the sheet glass 28 are brought into close contact with each other. It should be noted that the original films 32 are provided with identification marks making it possible to discriminate between the Y plate, M plate, C plate, and BK plate, so that a desired one of the original films 32 can be selected easily.

In addition, a light source for emitting ultraviolet light is disposed below the Fresnel lens 29.

In this embodiment, as the light source, a microwave-powered light source 44 is used which exhibits a distribution of light intensity necessary for imparting an appropriate exposure to a light-sensitive material whose change in the light intensity is small with a change over time and which exhibits at least three spectral sensitivities in an ultraviolet wavelength region (e.g., 330–435 nm). In addition, it is known that the microwave-powered light source 44 radiates ultraviolet light of a high light intensity. This microwave-powered light source 44 has a reflecting plate 46 having a substantially semi-spherical configuration, and a light-emitting point 48 of the microwave-powered light source 44 located at a position slightly offset from the focal point of the reflecting plate 46 in a direction away from the sheet glass 28 (i.e., toward the lower side in FIG. 3). Accordingly, part of the light emitted from the light-emitting point 48 is directly emitted as light toward the sheet glass 28, and the remaining portion of the light emitted from the light-emitting point 48 is radiated toward the sheet glass 28 as light reflected from the reflecting plate 46.

An interference filter unit 49 is disposed in the vicinity of the microwave-powered light source 44 at a position between the microwave-powered light source 44 and the Fresnel lens 29. This interference filter unit 49 is comprised of a disk-like turret 50 and a drive motor 52 having a drive shaft connected to an axis of the turret 50. As shown in FIG. 1, four circular holes 54 are formed in the turret 50 at substantially equal distances from each other about the axis. Three interference filters 56A, 56B, and 56C and transparent glass (or a neutral gray filter) 57 for exposure with the corresponding films 32, i.e., the Y plate, M plate, C plate, and BK plate, are fixed in these circular holes 54.

Figure 7:
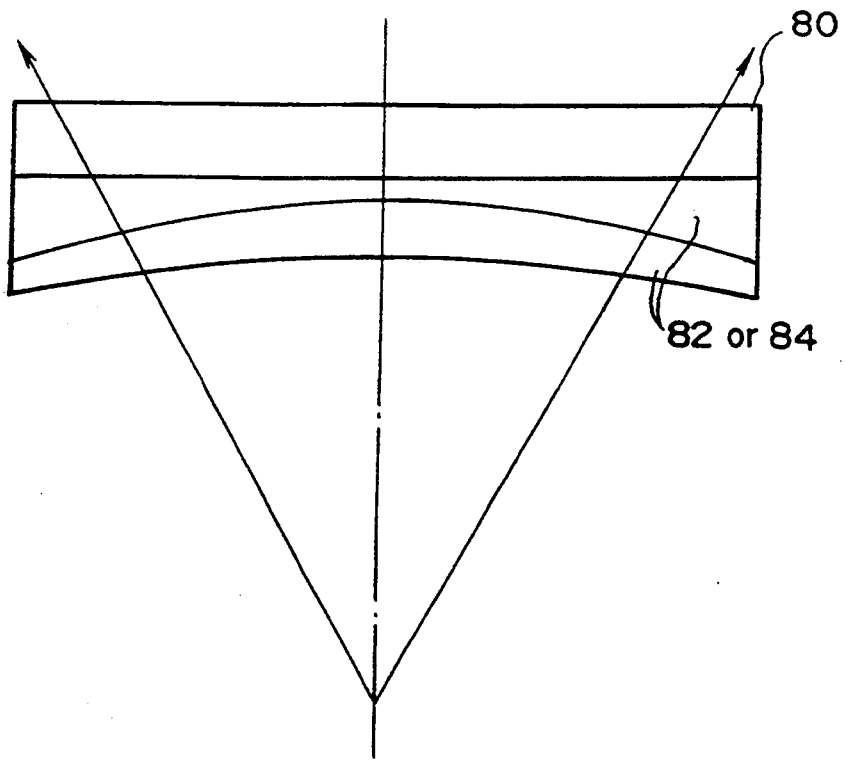
FIG. 7 is a schematic cross-sectional view illustrating boundaries of an interference filter in a case where ultraviolet light is applied therethrough from a point source.
Figure 8:
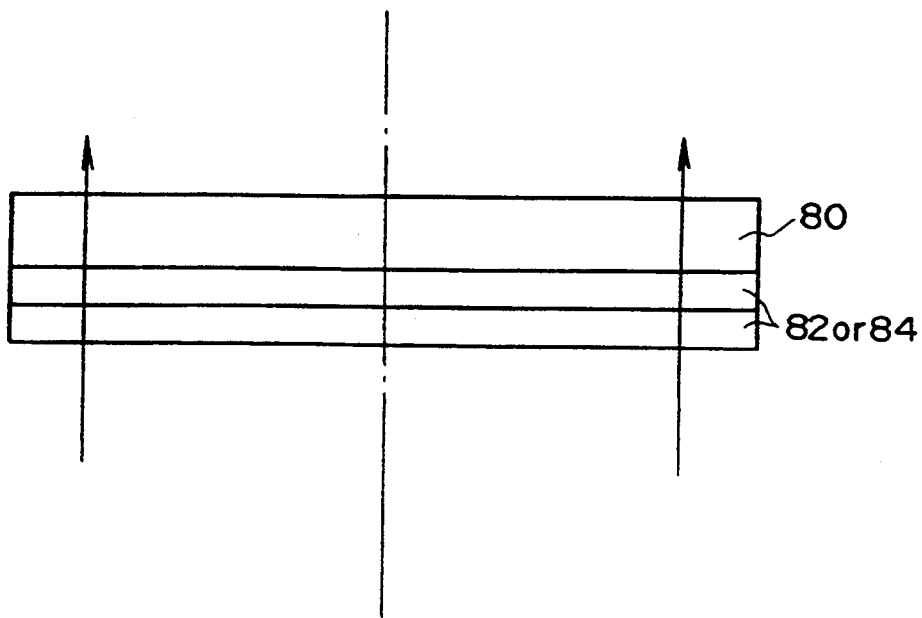
FIG. 8 is a schematic cross-sectional view illustrating boundaries of another interference filter in a case where collimated ultraviolet light is applied therethrough.

In each of the interference filters 56 used in this embodiment, thin films are vacuum-deposited on a surface of plane parallel sheet glass 80. Specifically, as shown in FIG. 8, the interference filter 56 is formed such that two thin films of a metal 82 and/or a dielectric 84 are consecutively vacuum-deposited uniformly on the plane parallel sheet glass 80. By changing the thickness of the thin films or the kind of material for forming the thin films during thin-film formation, the wavelength region of the transmitted light can be specified when collimated light is made incident upon the interference filter 56. Here, the light emitted radially from the light-emitting point as in the case of the point source is made incident diagonally thereon other than at the optical axis of the interference filter. However, if the angle of incidence of the interference filter changes, the wavelength region of the transmitted light expands, with the result that a light-sensitive layer other than the light-sensitive layer of the light-sensitive material to be exposed is also exposed simultaneously. Consequently, the mixing of colors occurs in the final image, so that color separation becomes deteriorated. For this reason, the interference filter 56 is formed such that, as shown in FIG. 7, the thin films are made gradually thicker from the optical axis toward the peripheral portions. In addition, the material(s) for thin-film formation is selected appropriately so as to allow the light of a specific wavelength region to be transmitted therethrough. As a result, the interference filter is capable of maintaining a predetermined half-width even with respect to the light emitted from the point source and made incident upon the interference filter diagonally.

It should be noted that in this embodiment, in the case of the light-sensitive material 16 of the positive type, the BK plates are respectively superposed on the Y plate, M plate, and C plate and are consecutively caused to adhere to the light-sensitive material 16 as the original films 32. Then, the ultraviolet light produced by the microwave-powered light source 44 is divided into respective light-sensitive wavelength regions (e.g., C=400–435 nm, M=365–400 nm, and Y=330–365 nm) of the light-sensitive material 16 corresponding to cyan (C), magenta (M), and yellow (Y), so as to effect exposure (in the state shown in FIG. 3). Meanwhile, in the case of the light-sensitive material 16 of the negative type, the Y, M, C, and BK plates are consecutively made to adhere to the light-sensitive material 16 as the original films 32, and the ultraviolet light produced by the microwave-powered light source 44 is separated into the respective light-sensitive wavelength regions of the light-sensitive material 16 corresponding to C, M, and M bymeans of the interference filters 56. Then, exposure is effected by using the transparent glass (or the neutral tray filter) 57 for allowing the ultraviolet light of the entire light-sensitive wavelength region of the light-sensitive material to be transmitted therethrough in correspondence with BK. Alternatively, only the filter insertion hole may be used instead of using the transparent glass. It should be noted that, at the time of the exposure corresponding to BK, a correction filter exhibiting absorption of an ultraviolet region may be used instead of the transparent glass (or neutral gray filter) 57, so as to correct the spectral sensitivity of the ultraviolet light-sensitive region.

As the interference filters 56, one filter may be used for each transmittance wavelength region, but it is preferable to narrow the half-width by combining two or more filters.

The drive motor 52 is constituted by a stepping motor and is adapted to rotate the turret 50 to a predetermined angle by means of a signal from the controller 42, thereby causing each of the interference filters 56 and the transparent glass (or neutral gray filter) 57 to be moved into or away from the optical path between the microwave-powered light source 44 and the Fresnel lens 29. In addition, filter selection buttons 62, which are disposed on this side, as viewed in FIG. 1, of the exposing section 26 on the casing 12, is connected to the controller 42. Thus, the controller 42 is adapted to control the rotation of the drive motor 52 in such a manner that the interference filter 56 or the transparent glass 57 selected by the filter selection button 62 is moved into the optical path between the microwave-powered light source 44 and the Fresnel lens 29.

The filter selection buttons 62 are comprised of filter selection buttons 62A, 62B, and 62C respectively corresponding to the C, M, and Y plate original films 32, as well as a filter selection button 62D for the BK plate original film 32 used in the case of the light-sensitive material 16 of the negative type.

An exposure start button 63 and an exposure stop button 65 are disposed in the vicinity of the filter selection buttons 62, and are respectively connected to the controller 42.

As shown in FIG. 3, a heat insulating filter 45 is disposed between the interference filter 56 and the light source 44 so as to prevent a rise in the temperature of the interference filter 56.

Each of the interference filters 56 is provided with a temperature sensor 58. These temperature sensors 58 are connected to the controller 42. The arrangement provided is such that when the temperature of the interference filter 56 has exceeded a predetermined value, the starting of exposure is prohibited by the controller 42, while if the temperature of the interference filter 56 has dropped below a predetermined value, the starting of exposure is allowed by the controller 42. In addition, a lamp 60 serving as a temperature-rise alarming means is disposed on this side, as viewed in the drawing, of the exposing section 26 on the casing 12. The lamp 60 is made to flash in response to an output from the controller 42.

A blow port of a blower 55 is provided in the vicinity of the interference filter 56, and a temperature rise of the interference filter 56 is prevented as air is blown onto it from the blower 55.

Figure 4:
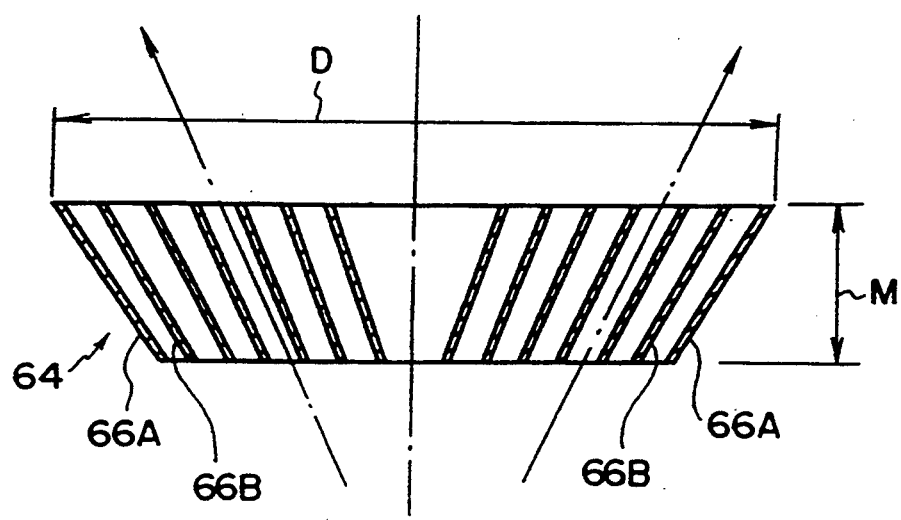
FIG. 4 is a cross-sectional view of a louver used in the color proof making apparatus in accordance with the first embodiment.

As shown in FIG. 3, a louver 64 is disposed on the microwave-powered light source 44 side of the interference filter 56 along the optical path. As shown in FIG. 4, the louver 64 is comprised of a plurality of (seven or eight) annular fins 66A, 66B, . . . , arranged concentrically. The fins 66A, 66B, . . . are connected to each other by two beams intersecting each other substantially at right angles and passing through the axis. The diameter of each of the fins 66A, 66B, . . . is made greater from the microwave-powered light source 44 side thereof (lower side in FIG. 4) toward the interference filter 56, so that the more outwardly the fin is located, the greater the diameter enlargement ratio. A maximum diameter D of the outermost fin 66A (louver 64) is set to be approximately 160 mm, and the length M of the louver 64 in the direction of the optical path is set to be 40 mm. Accordingly, only the direct light emitted from the light-emitting point 48 and the light made to enter the louver 64 in a direction substantially identical with that of the direct light in the light reflected by the reflecting plate 46 are made to pass through the louver 64.

As shown in FIG. 3, an integral light-quantity meter serving as a light-quantity integrating means is disposed on the microwave-powered light source 44 side of the louver 64. A light-receiving portion 68A of this integral light quantity meter 68 is disposed in the optical path between the interference filter 56 and the microwave-powered light source 44. This integral light-quantity meter 68 is connected to the controller 42, and the controller 42 calculates an exposure for the light-sensitive material on the basis of an input from the integral light-quantity meter 68, and turns off the microwave-powered light source 44 when the integral light quantity has reached a predetermined value.

Figure 5:
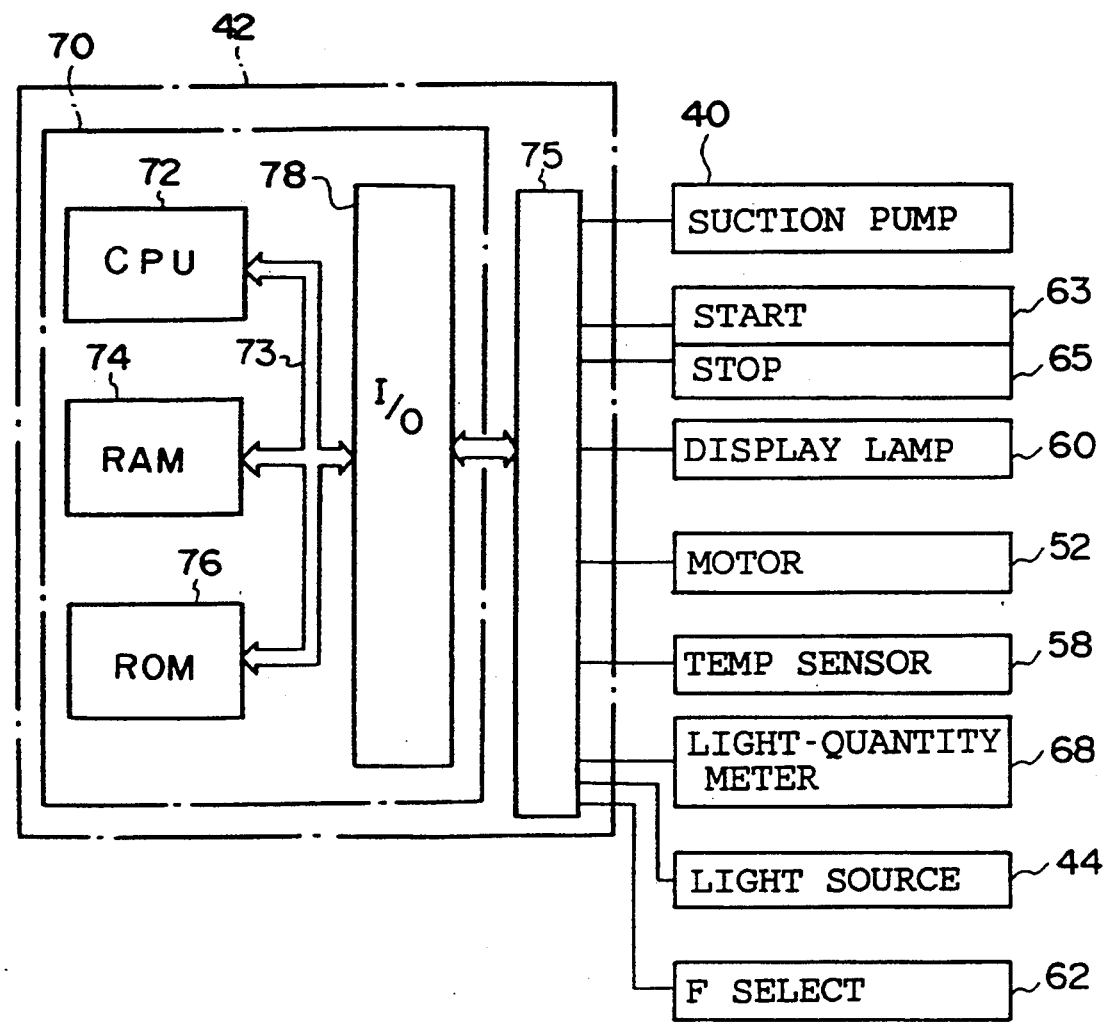
FIG. 5 is a block diagram for controlling the color proof making apparatus in accordance with the first embodiment.

As shown in FIG. 5, the controller 42 is constituted by a microcomputer 70. The microcomputer 70 comprises a CPU 72, a RAM 74, a ROM 76, input/output ports 78, and a bus 73 including data buses for connecting them and control buses.

The stepping motor 52, the microwave-powered light source 44, the suction pump 40, the temperature sensors 58, and the like are connected to the input/output ports 78 of the microcomputer 70 via a driver 75.

As shown in FIG. 1, a heat development section 81 is provided on the right-hand side of the casing 12 of the color proof making apparatus 10. A light-sensitive-material insertion port 83A is formed in an upper portion of the heat development section 81. The heat development section 81 incorporates therein a large-diameter heat roller 86, a plurality of small-diameter rollers 87A disposed along an outer periphery of the heat roller 86, and a belt 87 wound around the small-diameter rollers 87A. A heater and a temperature sensor (neither are shown) of the heat roller 86 are connected to the controller 42, so that the heating of the heat roller 86 is controlled to a predetermined temperature by the controller 42. Accordingly, the exposed light-sensitive material 16 inserted through the light-sensitive-material insertion port 83A is transported along the outer periphery of the heat roller 86 while being nipped by the belt 87 and the heat roller 86. The arrangement provided is such that as the light-sensitive material 16 is transported while abutting against the periphery of the heat roller 86 approximately a ¾ revolution thereof, the light-sensitive material 16 is heat developed. A light-sensitive-material discharge port 83B is formed in a right-hand surface, as viewed in FIG. 1, of the heat development section 81. The heat-developed light-sensitive material 16 is discharged through this light-sensitive-material discharge port 83B, and is accommodated on a tray 90 disposed below the light-sensitive-material discharge port 83B.

A description will now be given of the operation of this first embodiment with reference to a control flowchart shown in FIG. 6.

First, the operator sets the original film 32 on the exposing section 26 after superposing the BK plate on the Y plate in the case of the light-sensitive material 16 of the positive type, for example. In this case, the operator sets the original film 32 in such a manner that the positioning pins 30 located on this side, as viewed in FIG. 1, of the exposing section 26 are inserted through the positioning holes formed in the edge of each original film 32 with the BK plate set on the light source side. As a result, the positioning of each original film 32 can be effected easily and accurately.

Next, the operator cuts the light-sensitive material 16 drawn out from the sensitive-material-roll accommodating section 14 to a predetermined length by means of the cutter 22, places the same in close contact with the original film 32, and closes the upper cover 34.

Meanwhile, when a power switch of the color proof making apparatus 10 is turned on, the controller 42 is operated to start the temperature control of the heat roller 86 in the heat development section 81. When the temperature reaches a level optimally suited for heat development, the color proof making apparatus 10 is set in a state of standby for making the color proof, and the control routine shown in FIG. 6 is started.

Upon starting of the control routine, in Step 102, the suction pump 40 is turned on, and a determination is made in Step 104 as to which of the filter selection buttons 62A, 62B, 62C, and 62D has been pressed.

If it is determined in Step 104 that the Y plate, for instance, has been selected as the original film 32 used for exposure, the angle of rotation of the drive motor 52 is controlled in Step 106 in such a manner that an interference filter A corresponding to that original film 32 will be moved to a predetermined position in the optical path. If the M plate has been selected as the original film 32 used for exposure, the angle of rotation of the drive motor 52 is controlled in Step 106 in such a manner that an interference filter B corresponding to that original film 32 will be moved to the predetermined position in the optical path. If the C plate has been selected as the original film 32 used for exposure, the angle of rotation of the drive motor 52 is controlled in Step 106 in such a manner that an interference filter C corresponding to that original film 32 will be moved to the predetermined position in the optical path.

In the case of the negative type, since the filter selection button 62D is pressed for the BK original film in addition to the aforementioned interference filters A, B, and C, so that the transparent glass (or neutral gray filter) 57 is also moved into the optical path.

Thus, since the interference filter 56 corresponding to the original film 32 and exhibiting the light-sensitive wavelength region of the light-sensitive material is selected and moved into the optical path, the light-sensitive material 16 can be exposed by ultraviolet light in respective light-sensitive wavelength regions corresponding to the types of original films 32.

Thus, a first interference filter 56 corresponding to the first original film 32 used for exposure is selected (Step 106).

In Step 108, a determination is made as to whether or not the exposure start button 63 has been pressed. If the exposure start button 63 has been pressed, in Step 112, the temperature T of the interference filter 56 moved into the optical path is detected by the temperature sensor 58, and a determination is made as to whether or not the temperature T of the interference filter 56 detected by the temperature sensor 58 has exceeded a predetermined value TO. If the temperature of the interference filter 56 has exceeded the predetermined value, the operation proceeds to Step 116 in which the microwave-powered light source 44 is not lit, the lamp 60 is flashed as an alarm until the temperature of the interference filter 56 drops to a predetermined value or less, and the operation returns to Step 108. If the temperature of the interference filter 56 is at the predetermined value or less, the operation proceeds to Step 114. In Step 114, an exposure amount Pi (i corresponds to any one of the Y, M, C, and BK plates) corresponding to the type of original film 32 is read, and the operation proceeds to Step 118. In Step 118, the microwave-powered light source 44 is lit, and exposure is started.

Accordingly, since it is possible to automatically prevent exposure from being effected in a state in which the filter characteristics of the interference filter 56 have changed, it is possible to prevent a decline in the image quality such as the mixing of colors as a result of a change in the absorption characteristics of the interference filter 56 due to heating. In addition, as the lamp 60 is flashed, it is possible to notify the operator that the temperature of the interference filter 56 has risen.

Then, when the microwave-powered light source 44 lights up, in Step 120, the measurement of a quality of light is started on the basis of an output from the integral light-quantity meter 68, and the operation proceeds to Step 122. In Step 122, a determination is made as to whether or not the exposure amount P has reached the predetermined exposure amount Pi, and if the exposure amount P has reached the predetermined exposure amount Pi corresponding to the original film 32, the operation proceeds to Step 124 to turn off the microwave-powered light source 44.

Thus, since the light-sensitive material 16 is exposed with an exposure amount corresponding to the type of original film 32, even if the original film 32 is replaced, exposure can be effected with an appropriate exposure amount corresponding to the type of original film 32. As a result, the operator is capable of effecting the operation without causing a change in the exposure amount in accordance with the type of original film 32. In addition, the light-receiving portion 68A of the integral light-quantity meter 68 is inserted in the optical path between the interference filter 56 and the microwave-powered light source 44. Accordingly, the quantity of light before entering the interference filter 56 after being emitted from the microwave-powered light source 44 can be integrated reliably. Even if the microwave-powered light source 44 becomes deteriorated and the quantity of light is declined, it is possible to apply a necessary quantity of light to the light-sensitive material 16, thereby making it possible to prevent a decline in the quality of the exposed image due to an underexposure.

The suction pump 40 remains actuated during the exposure of each of the original films 32, and if the operator opens the upper cover 34, the light-sensitive material 16 is attached to the upper cover 36. For this reason, the operator can easily replace the original film 32 without needing to position the light-sensitive material 16. That is, for instance, if the exposure of the first original film 32 is completed and the original film 32 is to be replaced, the operator can remove the light-sensitive material 16 integral with the upper cover 34 from the original film 32 by opening the upper cover 34. In addition, if the hinges 35 are constructed with no play, the operator, after replacing the original film 32, is capable of positioning the light-sensitive material 16 on the original film 32 simply by closing the upper cover 34. Accordingly, the efficiency of the exposing operation can be improved. In addition, even if play is present in the hinges 35, since the holes, through which the pins 30 are inserted when the upper cover 34 is closed, are provided in the upper cover 34, the light-sensitive material 16 can be positioned accurately on the original film 32.

When the upper cover 34 is closed upon completion of the replacement of the original film 32, the operation returns to Step 102 to wait for an ensuing filter to be selected by means of the filter selection button 62, and the exposure of a ensuing original film 32 is started. Thus, when the exposure of the initial original film 32 is completed, the operation returns to Step 104, a similar exposing operation is effected four times in total in the case of the light-sensitive material 16 of the negative type, and three times in total in the case of the light-sensitive material 16 of the positive type.

Meanwhile, when the exposure of all the original films 32 is completed, and the exposure stop button 65 is pressed by the operator, a determination is made in Step 110 that the exposing operation is completed. Then, the operation proceeds to Step 126 to stop the operation of the suction pump 40, thereby completing this control routine.

Subsequently, when the operator inserts the exposed light-sensitive material 16 into the heat development section 81 through the light-sensitive-material insertion port 83A, the light-sensitive material 16 thus inserted into the heat development section 81 is transported in contact with the heat roller 86 so as to be subjected to heat development. The developed light-sensitive material 16 is then discharged onto the tray 90 through the light-sensitive-material discharge port 83B.

In this embodiment, the microwave-powered light source 44 is used as the light source, and the ultraviolet light emitted from the microwave-powered light source 44 is applied to the light-sensitive material 16 via the interference filter 56. Accordingly, the interference filter 56 transmits only the ultraviolet light of an ultraviolet light-sensitive wavelength region for forming a predetermined dye image in one exposure, and does not transmit the ultraviolet light of ultraviolet-light-sensitive wavelength regions for forming other dye images. Hence, it is possible to make a color proof with excellent color separation without causing the mixing of colors. Since high-intensity ultraviolet light is radiated by the use of the microwave-powered light source 44, ultraviolet light of an appropriate intensity is applied to the light-sensitive material 16. As a result, it is possible to complete the exposure of the light-sensitive material 16 in a short time without prolonging the exposure time.

In this embodiment, in the case where the temperature T of the interference filter 56 moved into the optical path has exceeded the predetermined value TO, the lighting of the microwave-powered light source 44 is automatically prohibited by the controller 42, and the lamp 60 is made to flash, as described above. Alternatively, an arrangement may be provided such that in the case where the temperature T of the interference filter 56 moved into the optical path has exceeded the predetermined value TO, only the flashing operation of the lamp 60 is controlled, and the flashing of the lamp 60 alarms a temperature rise of the interference filter 56 so as to allow the operator to stop the exposing operation. In addition, although in the above-described embodiment the temperature sensor 58 is provided for each interference filter 56, an arrangement may be alternatively provided such that a temperature sensor is disposed in the vicinity of a position where the interference filter 56 is moved into the optical path, and the ambient temperature at that location is measured so as to be substituted for the temperature of the interference filter 56. Furthermore, although in this embodiment a plurality of small holes 37 are provided as part of the means for sucking the light-sensitive material, elongated notches, grooves, or the like may be provided instead of these small holes 37.

Second Embodiment

Figure 9:
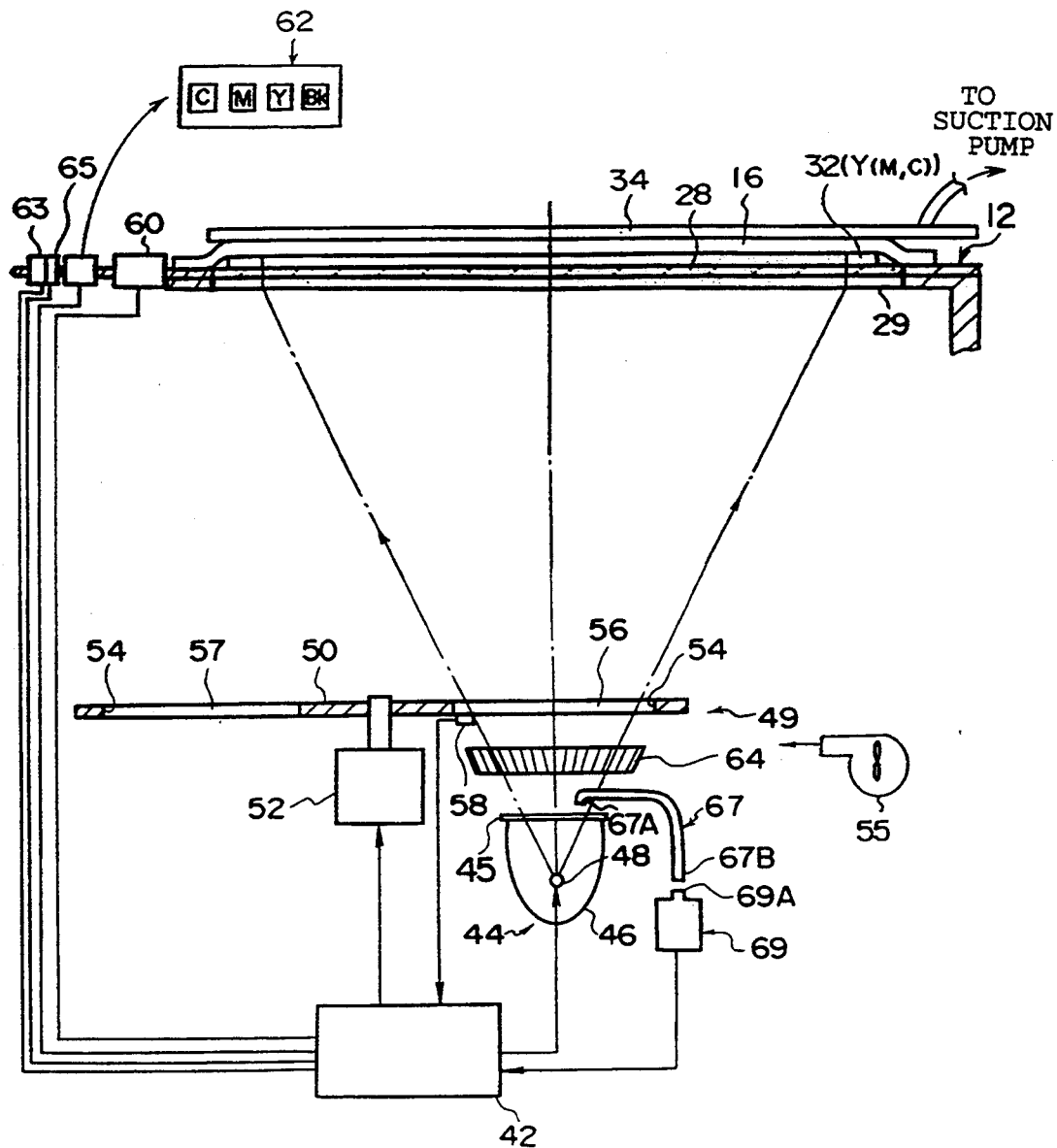
FIG. 9 is a schematic cross-sectional view of an exposing section of the color proof making apparatus in accordance with a second embodiment.

Referring now to FIG. 9, a description will be given of a second embodiment of the present invention. It should be noted that those members, portions, arrangements and the like that are identical to those of the first embodiment will be denoted by the same reference numerals, and a description thereof will be omitted.

One end portion (light-receiving portion) 67A of an optical fiber serving as a light transmitting cable is disposed in the optical path between the interference filter 56 and the microwave-powered light source 44. The other end portion (light-fetching portion) 67B of this optical fiber is disposed in such a manner as to face alight-receiving portion 69A of an integral light-quantity meter 69 serving as the light-quantity integrating means. Accordingly, part of the light before entering the interference filter 56 after being emitted from the microwave-powered light source 44 is made incident upon the integral light-quantity meter 69 via this optical fiber 67. For this reason, even if the distance between the interference filter 56 and the microwave-powered light source 44 is small, the quantity of light before entering the interference filter 56 can be integrated reliably. Accordingly, even if the microwave-powered light source 44 becomes deteriorated and the quantity of light is declined, it is possible to apply a necessary quantity of light to the light-sensitive material 16 by extending the exposure time until the quantity of light integrated by the integral light-quantity meter 69 reaches a predetermined quantity, thereby making it possible to prevent a decline in the quality of the image due to an underexposure.

Third Embodiment

Figure 10:
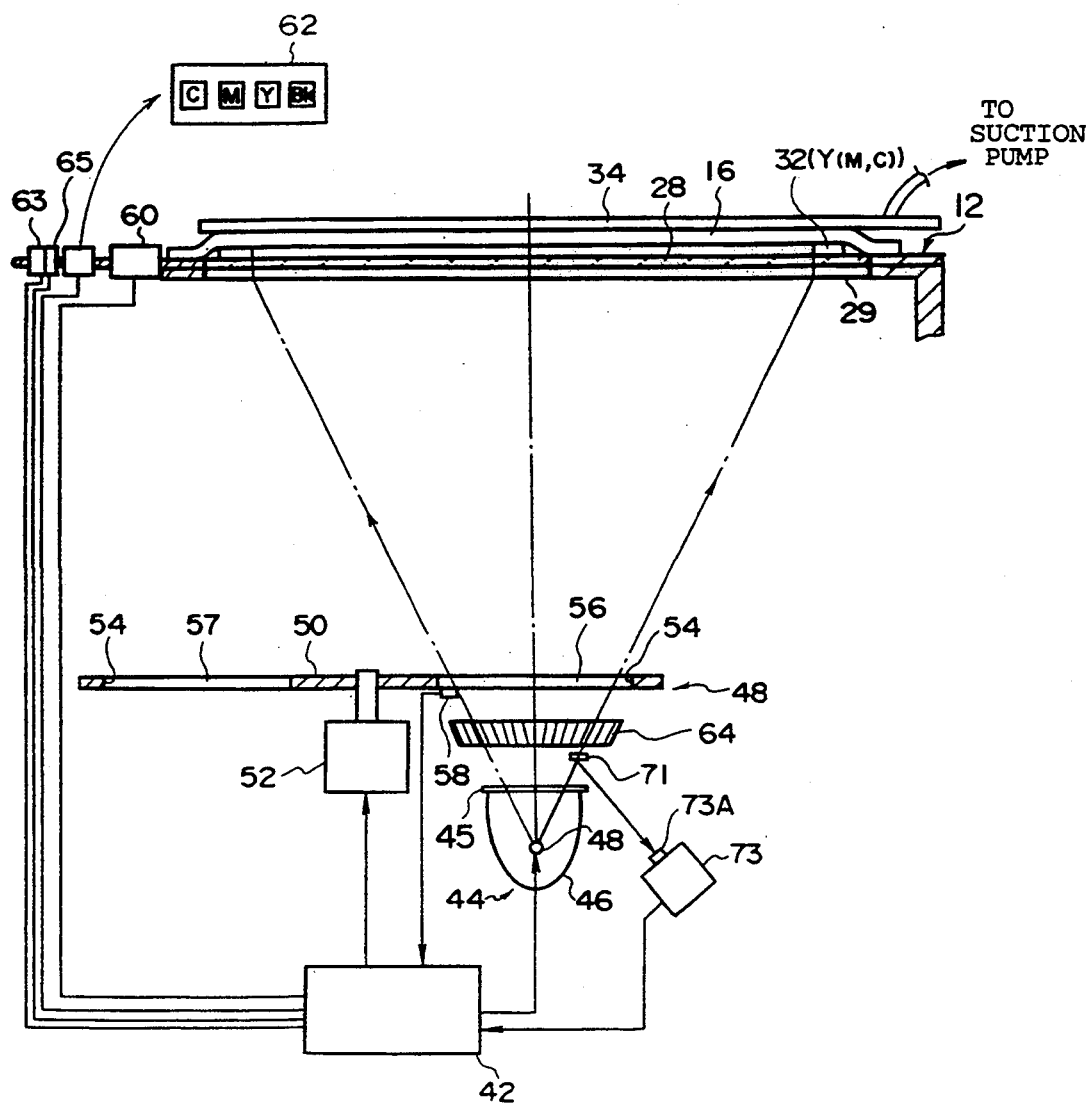
FIG. 10 is a schematic cross-sectional view of an exposing section of the color proof making apparatus in accordance with a third embodiment.

Referring now to FIG. 10, a description will be given of a third embodiment. It should be noted that those members, portions, arrangements and the like that are identical to those of the first embodiment will be denoted by the same reference numerals, and a description thereof will be omitted.

A mirror 71 serving as a light reflecting means is disposed in the optical path between the interference filter 56 and the microwave-powered light source 44. This mirror 71 is adapted to reflect part of the light emitted from the microwave-powered light source 44 toward a light-receiving portion 73A of an integral light-quantity meter 73 serving as the light-quantity integrating means. Accordingly, part of the light emitted from the microwave-powered light source 44 is reflected toward the light-receiving portion 73A of the integral light-quantity meter 73, and is made incident upon the integral light-quantity meter. For this reason, even if the distance between the interference filter 56 and the microwave-powered light source 44 is small, the quantity of light before entering the interference filter 56 can be integrated reliably. Accordingly, even if the microwave-powered light source 44 becomes deteriorated and the quantity of light is declined, it is possible to apply a necessary quantity of light to the light-sensitive material 16 by extending the exposure time until the quantity of light integrated by the integral light-quantity meter 69 reaches a predetermined quantity, thereby making it possible to prevent a decline in the quality of the image due to an underexposure.

Fourth Embodiment

Figure 11:
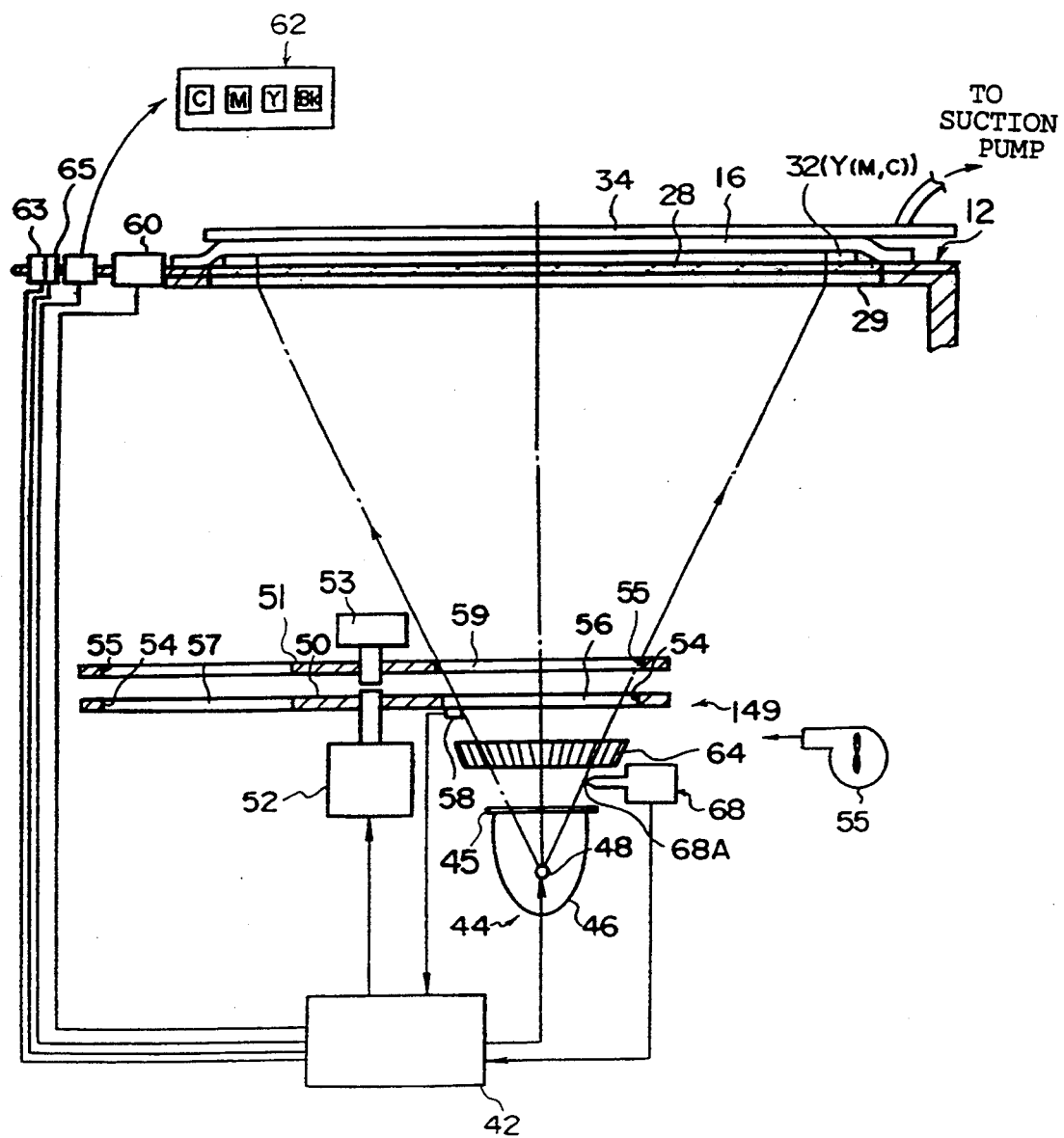
FIG. 11 is a schematic cross-sectional view of an exposing section of the color proof making apparatus in accordance with a fourth embodiment.

Referring now to FIG. 11, a description will be given of a fourth embodiment. It should be noted that those members, portions, arrangements and the like that are identical to those of the first embodiment will be denoted by the same reference numerals, and a description thereof will be omitted.

A filter unit 149 of this embodiment is comprised of a pair of disk-like turrets 50 and 51 and drive motors 52 and 53 having drive shafts respectively connected to the axes of the turrets 50 and 51. The turret 51 has two circular holes formed therein at positions substantially symmetric with respect to its axis. A light-reducing filter 59 for reducing the quantity of light from the microwave-powered light source 44 in response to the sensitivity of the original film 32 is attached in one of the circular holes 55, while the other one of the circular holes 55 used as a through hole.

The drive motor 53 is constituted by a stepping motor and is adapted to rotate the turret 51 to a predetermined angle by means of a signal from the controller 42, thereby causing either the light-reducing filter 59 or the through hole to be moved into or away from the optical path between the microwave-powered light source 44 and the Fresnel lens 29. In addition, a light-quantity selection button (not shown), which is disposed on this side, as viewed in FIG. 1, of the exposing section 26 on the casing 12, is connected to the controller 42. Thus, the controller 42 is adapted to control the rotation of the drive motor 53 in such a manner that the light-reducing filter 59 or the through hole selected by the light-quantity selection button (not shown) is moved into the optical path between the microwave-powered light source 44 and the Fresnel lens 29.

Figure 6:
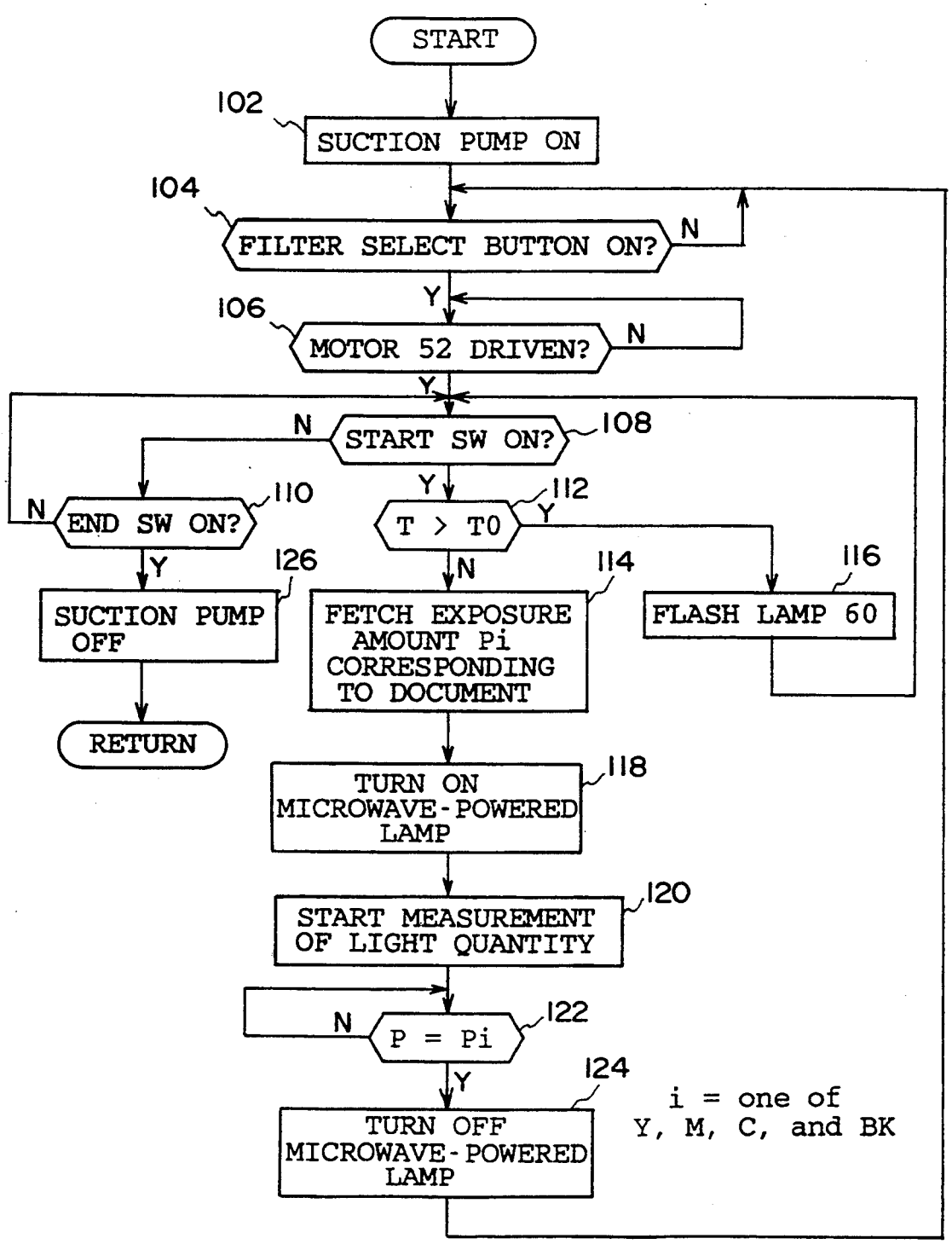
FIG. 6 is a flowchart for controlling the color proof making apparatus in accordance with the first embodiment.

Accordingly, in Step 102 (see FIG. 6 illustrating the first embodiment), if the light-reducing filter 59 or the through hole is selected by the light-quantity selection button (not shown) in correspondence with the original film 32 used for exposure, the rotation of the drive motor 53 is controlled in correspondence with the light-reducing filter 59 or the through hole selected, and the selected one is moved into the optical path. In this embodiment, the three interference filters 56 for allowing ultraviolet light having wavelength regions respectively corresponding to the color-separated original films 32 to be transmitted therethrough, as well as the transparent glass 57 and the light-reducing filter 59 are provided in the filter unit 149. Accordingly, when the three interference filters 56, the transparent glass 57, and the light-reducing filter 59 are assembled, the three interference filters 56, the transparent glass 57, and the light-reducing filter 59 can be assembled very simply by assembling the filter unit 149. Consequently, the efficiency in assembling the interference filters can be improved.

Although, in the first embodiment and this fourth embodiment, the filter units 49 and 149 have a structure which includes the drive motor 52 and the drive motors 52 and 53, respectively, a structure may be alternatively adopted such that the filter units 49 and 149 do not include a motor, respectively. In addition, although in the first embodiment and this fourth embodiment the filters are fitted in the disk-shaped turret, an arrangement may be alternatively provided such that each filter formed in the shape of a sheet is taken out from a filter accommodating section provided separately and is moved into the optical path, and the filter is stored back into the filter accommodating section after completion of exposure. Furthermore, an arrangement may be provided such that at least three interference filters, one light-reducing filter, and one transparent filter are provided in one turret.

Fifth Embodiment

Figure 12:
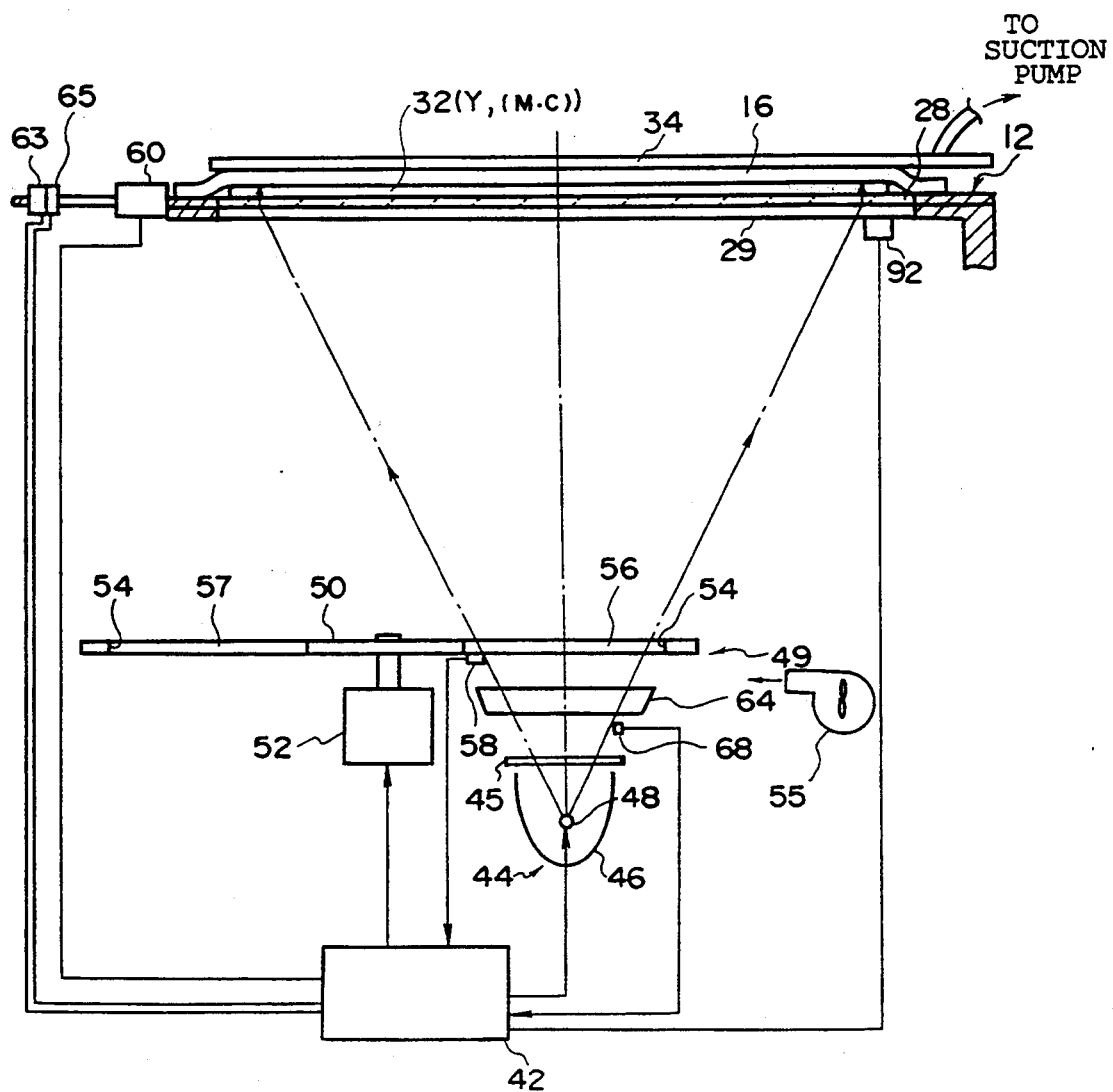
FIG. 12 is a schematic cross-sectional view of an exposing section of the color proof making apparatus in accordance with a fifth embodiment.

Referring now to FIG. 12, a description will be given of a fifth embodiment. It should be noted that those members, portions, arrangements and the like that are identical to those of the first embodiment will be denoted by the same reference numerals, and a description thereof will be omitted.

In the first embodiment, a description has been given of an example in which the interference filter is selected by pressing the film selection button in correspondence with an identification mark provided on the original film to be exposed. In this embodiment, a description will be given of a case where the original film to be exposed is identified by reading this identification mark.

A read sensor 92 is disposed on the underside of the Fresnel lens 29 and is adapted to read an original-film identification mark recorded on an edge portion of each original film 32. The read sensor 92 is located outside the range of application of the ultraviolet light so that it will not interrupt the ultraviolet light radiated from the microwave-powered light source 44 to the light-sensitive material 16. The read sensor 92 is connected to the controller 42 so that a signal corresponding to the identification mark read from the original film will be inputted to the controller 42. As this identification mark, it is possible to use optical marks, such as bar codes and light-spot type marks indicating the type of the color original of the original film 32. In addition, holes may be formed at predetermined positions in correspondence with the types of the color originals of the original films 32, and the type of original film 32 may be identified by reading the position of this hole.

In this case, in Step 104 in the control routine shown in FIG. 6 illustrating the first embodiment, instead of pressing the filter selection button, the step is substituted by processing for reading the original-film identification mark by means of the read sensor 92. Accordingly, it is sufficient for the operator to merely replace the original film 32. The order of exposure (e.g., the order of the Y plate, M plate, and C plate) may be set in advance, and the filter may be changed over consecutively in that order.

As a result, in this embodiment, if the original film 32 is only set on the apparatus, the original film 32 is automatically discriminated, and an appropriate one of the interference filters 56 corresponding to the original film 32 is moved into optical path. Thus, since the discrimination of the original film 32 is effected automatically, it is sufficient for the operator to merely replace the original film 32, so that the processing operation can be simplified.

Sixth Embodiment

Next, a description will be given of a sixth embodiment of the present invention.

In the first embodiment, a description has been given of an example in which ultraviolet light is applied to the light-sensitive material 16 in such a manner that the wavelength region of the ultraviolet light applied to the light-sensitive material 16 becomes a predetermined wavelength region by means of the interference filter 56 by using the microwave-powered light source 44. In this sixth embodiment, a description will be given of a case in which a plurality of light sources (e.g., fluorescent lamps) for emitting ultraviolet light of a plurality of different ultraviolet wavelength regions are provided, and the ultraviolet light is applied to the light-sensitive material 16 by separately or simultaneously turning on the plurality of light sources. It should be noted that since this embodiment is arranged in a manner substantially in the same way as the first embodiment, identical members or portions will be denoted by the same reference numerals, and a detailed description thereof will be omitted.

Figure 13:
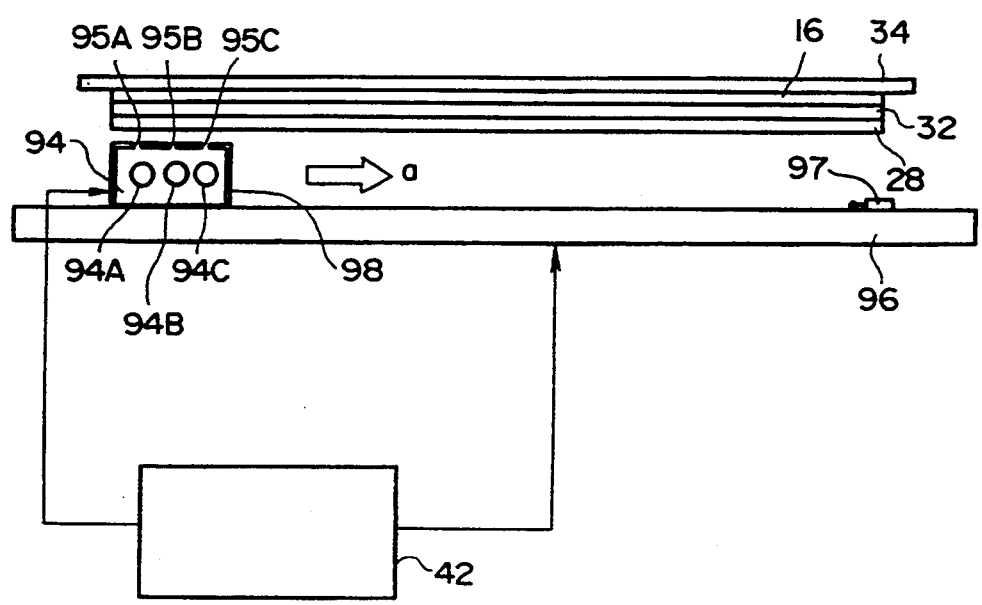
FIG. 13 is a schematic cross-sectional view of an exposing section of the color proof making apparatus in accordance with a sixth embodiment.

As shown in FIG. 13, a light source box 98 for emitting ultraviolet light is disposed below the sheet glass 28 within the casing 12.

This light source box 98 has fluorescent lamps 94A, 94B, and 94C for emitting ultraviolet light exhibiting maximum luminescence in the ranges of three kinds of ultraviolet wavelength regions (330–365 nm, 365–400 nm, and 400–435 nm), respectively. These three kinds of ultraviolet wavelength regions correspond to the light-sensitive wavelength regions (C=400–435 nm, M=365–400 nm, and Y=330–365 nm) of the light-sensitive material corresponding to C, M, and Y, respectively. Thus, since the ultraviolet light of the light sources themselves corresponds to the light-sensitive wavelength regions of the light-sensitive material 16, it is unnecessary to divide the ultraviolet light applied to the light-sensitive material 16 into predetermined wavelength regions by means of filters such as the interference filters 56.

The fluorescent lamps 94 are respectively connected to the controller 42 via an unillustrated driver. The turning on and off of the fluorescent lamps 94A–94C as well as the operation of unillustrated shutters provided for slits 95A–95C corresponding to the fluorescent lamps 94A–94C are controlled in response to a control signal from the controller 42. The light source box 98 is arranged in such a manner as to be capable of sliding on a stage 96 fixed to the casing 12 by means of a belt, a chain, or the like, and is adapted to be moved by an unillustrated moving means. This belt, chain, or the like is connected to a driving source such as a stepping motor, and is adapted to move horizontally (in the direction of arrow in FIG. 13) by a predetermined amount by means of a signal from the controller 42, thereby allowing the light to be applied to the entire surface of the light-sensitive material 16. The light source box 98 is also connected to the controller 42, and the position of the light source box 98 can be detected. When ultraviolet light is emitted consecutively from the fluorescent lamps 94, the ultraviolet light emitted from the respective fluorescent lamps 94A–94C within the light source box is controlled in such a manner as to overlap within a predetermined range of the light-sensitive material 16 through the slits 95A–95C. As a result, even if the light-sensitive material 16 is irradiated with the ultraviolet light from the different fluorescent lamps 94A–94C, no offset occurs in the resultant image.

It should be noted that, in the case of the light-sensitive material 16 of the negative type, exposure is effected by using the light from the fluorescent lamps 94A–94C with respect to the color-separated Y plate, M plate, and C plate, respectively. In addition, with respect to the BK plate, all the fluorescent lamps 94A–94C are turned on to effect exposure in the entire ultraviolet light-sensitive wavelength regions.

Figure 14:
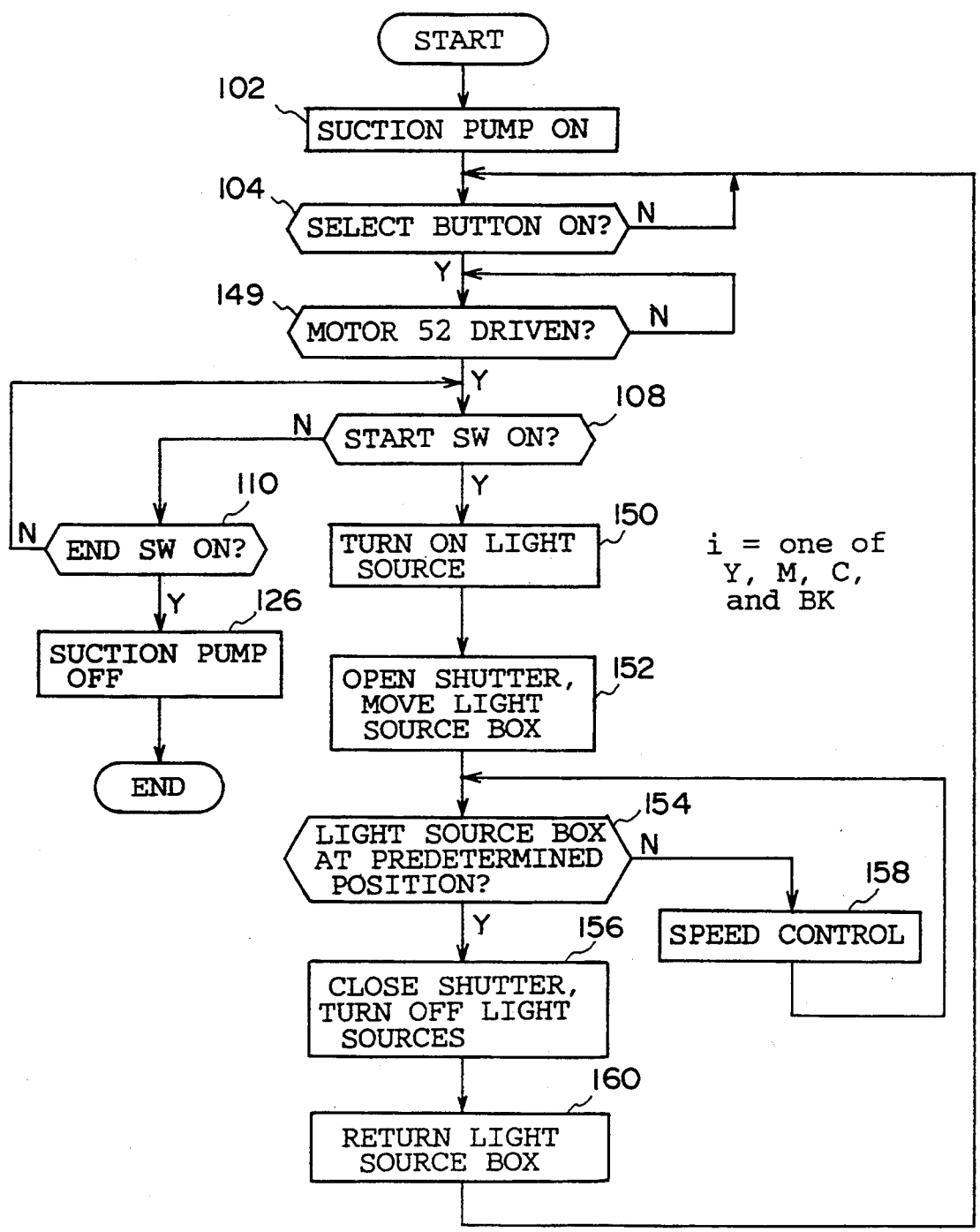
FIG. 14 is a flowchart for controlling the color proof making apparatus in accordance with the sixth embodiment of the present invention.

The operation of this embodiment will now be given with reference to the control flow chart shown in FIG. 14.

First, the operator sets the original film 32, e.g., the BK plate superposed on the Y plate, on the exposing section 26 of the color proof making apparatus 10. Next, the operator cuts the light-sensitive material 16 drawn out from the sensitive-material-roll accommodating section 14 to a predetermined length by means of the cutter 22, places the same in close contact with the original film 32, and closes the upper cover 34.

When the power switch of the color proof making apparatus 10 is turned on, the controller 42 is operated to start temperature control of the heat roller 86 in the heat development section 81. When the temperature reaches a level optimally suited for heat development, the color proof making apparatus 10 is set in a state of standby for making the color proof, and the control routine shown in FIG. 14 is started.

Upon starting of the control routine, in Step 102, the suction pump 40 is turned on, and a determination is made in Step 104 as to which of the filter selection buttons 62A, 62B, 62C, and 62D has been pressed. In this embodiment, since the interference filters 56 are not required, the filter selection buttons 62 can be used as selection buttons for selecting the fluorescent lamps 94.

If it is determined in Step 104 that the Y plate, for instance, has been selected as the original film 32 used for exposure, the fluorescent lamp 94A corresponding to that original film 32 is turned on, and the slit 95A corresponding to this fluorescent lamp 94A is opened. In Step 149, the light source box 98 is moved by the unillustrated driving means in such a manner that the ultraviolet light emitted from the fluorescent lamp 94A is applied to the light-sensitive material 16 via the Y plate through the slit 95A while scanning the same. If the M plate has been selected as the original film 32 used for exposure, the fluorescent lamp 94B corresponding to that original film 32 is turned on, and the slit 95B corresponding to this fluorescent lamp 94B is opened. In Step 149, the light source box 98 is moved by the unillustrated driving means in such a manner that the ultraviolet light emitted from the fluorescent lamp 94B is applied to the light-sensitive material 16 via the M plate through the slit 95B while scanning the same. If the C plate has been selected as the original film 32 used for exposure, the fluorescent lamp 94C corresponding to that original film 32 is turned on, and the slit 95C corresponding to this fluorescent lamp 94C is opened. In Step 149, the light source box 98 is moved by the unillustrated driving means in such a manner that the ultraviolet light emitted from the fluorescent lamp 94C is applied to the light-sensitive material 16 via the C plate through the slit 95C while scanning the same.

In the case of the light-sensitive material 16 of the negative type, since the filter selection button 62D is pressed for the BK original film in addition to the aforementioned interference filters A, B, and C, the transparent glass (or neutral gray filter) 57 is also moved into the optical path.

Since the fluorescent lamp 94 of the light-sensitive wavelength region of the light-sensitive material 16 corresponding to the original film 32 is selected in the above-described manner, the light-sensitive material 16 can be exposed by the ultraviolet light of the respective light-sensitive wavelength region of the light-sensitive material 16 corresponding to the type of original film 32.

Thus, the first fluorescent lamp 94 corresponding to the initial original film 32 used for exposure is selected (Step 149).

In Step 108, a determination is made as to whether or not the exposure start button 63 has been pressed. If the exposure start button 63 is pressed, the operation proceeds to Step 150. In Step 150, any of the fluorescent lamps 94A, 94B, and 94C corresponding to the type of original film 32 is turned on. In Step 152, the shutter of the fluorescent lamp 94 turned on is opened, and the light source box 98 is moved in the direction of arrow a in FIG. 13 to start scanning exposure.

In this case, scanning is effected at a predetermined scanning speed in such a manner as to effect exposure with a predetermined exposure amount corresponding to each original film 32. In Step 154, whether or not the light source box 98 has reached a predetermined position away from a reference position is detected by a detecting means (e.g., a microswitch) 97. If YES is given as the answer in the determination, in Step 156, the light source box 98 is stopped, and the shutter is closed and the light source is turned off. In Step 158, the moving speed of the light source box 98 is controlled in correspondence with the exposure amount Pi. In Step 160, the light source box 98 is returned at high speed to the reference position (the position shown in FIG. 13).

The suction pump 40 remains actuated during the exposure of each of the original films 32, and if the operator opens the upper cover 34, the light-sensitive material 16 is attached to the upper cover 36. For this reason, the operator can easily replace the original film 32 without needing to position the light-sensitive material 16. When the upper cover 34 is closed upon completion of the replacement of the original film 32, the operation returns to Step 102 to wait for an ensuing fluorescent lamp 94 to be selected by means of the filter (fluorescent lamp) selection button 62, and the exposure of a ensuing original film 32 is started. Thus, when the exposure of the initial original film 32 is completed, the operation returns to Step 104, a similar exposing operation is effected four times in total in the case of the light-sensitive material 16 of the negative type, and three times in total in the case of the light-sensitive material 16 of the positive type.

Meanwhile, when the exposure of all the original films 32 is completed, and the exposure stop button 65 is pressed by the operator, a determination is made in Step 110 that the exposing operation is completed. Then, the operation proceeds to Step 126 to stop the operation of the suction pump 40, thereby completing this control routine.

Subsequently, when the operator inserts the exposed light-sensitive material 16 into the heat development section 81 through the light-sensitive-material insertion port 83A, the light-sensitive material 16 thus inserted into the heat development section 81 is transported in contact with the heat roller 86 so as to be subjected to heat development. The developed light-sensitive material 16 is then discharged onto the tray 90 through the light-sensitive-material discharge port 83B.

In this embodiment, exposure of the light-sensitive material 16 is effected by using as a light source a plurality of fluorescent lamps 94 for emitting light in ultraviolet wavelength regions corresponding to the spectral sensitivity distribution of the light-sensitive material 16. Accordingly, it is unnecessary to divide the ultraviolet light in such a manner as to be adjusted to the spectral sensitivity of the light-sensitive material 16 by using the filters. In addition, since exposure is effected by scanning exposure, it is possible to perform exposure without using a complicated optical system. In this case, instead of moving the light source, the original film 32 and the light-sensitive material 16 may be moved by a moving means.

It should be noted that although, in this embodiment, a description has been given of an example in which the plurality of light sources are arranged horizontally, an arrangement may be alternatively provided such that the plurality of light sources are disposed in a polygonal light source box, and the light source box is rotated.

Seventh Embodiment

A description will now be given of a seventh embodiment of the present invention. As the seventh embodiment, a description will be given of a case where the light source for emitting ultraviolet light is disposed above the sheet glass 28 and the Fresnel lens 29, and the ultraviolet light is applied to the light-sensitive material 16 via each interference filter 56 for allowing the ultraviolet light of a specific ultraviolet wavelength region to be transmitted therethrough. It should be noted that since this embodiment is arranged in a manner substantially in the same way as the first embodiment, identical members or portions will be denoted by the same reference numerals, and a detailed description thereof will be omitted.

Figure 15:
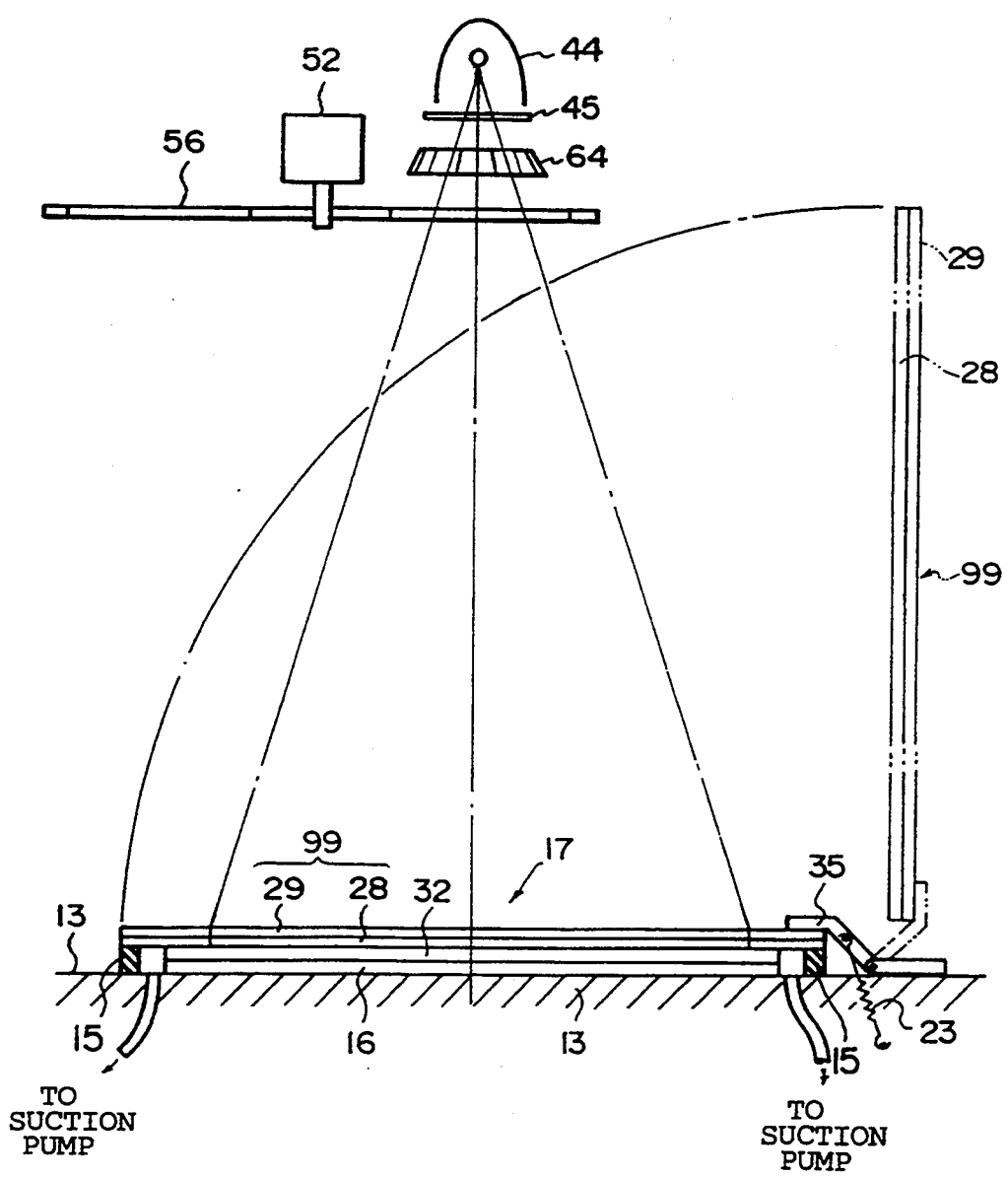
FIG. 15 is a schematic cross-sectional view of an exposing section of the color proof making apparatus in accordance with a seventh embodiment.

As shown in FIG. 15, in this embodiment, the color proof making apparatus 10 has a surface plate 13. Although not shown, the sensitive-material-roll accommodating section 14 and the heat development section 81 similar to those of the first embodiment are disposed on the side of the surface plate 13. The pair of positioning pins 30 are disposed upright on this side, as viewed in FIG. 15, of the surface plate 13. As these positioning pins 30 are inserted through positioning holes formed in an edge of each of the original films 32 including the color-separated Y plate, M plate, C plate, and BK plate, the positioning of the original films 32 can be effected easily and accurately.

One of the hinges 35 is attached to a rear surface of the surface plate 13, while an upper cover portion 99 swingable about the other hinge 35 is attached to that hinge 35. The upper cover portion 99 is adapted to cover a light-sensitive-material setting section 17 during exposure. This upper cover portion 99 is comprised of the sheet glass 28 and the Fresnel lens 29, and is arranged in such a manner that the Fresnel lens 29 is brought into close contact with the top of the sheet glass 28. During exposure, parallel rays are applied to the light-sensitive material 16 via each of the original films 32.

The hinge 35 is provided with a resilient spring 33, and when the top cover portion 99 is swung from one side to the other, the top cover portion 99 is urged in the manner of a snap action by the resilient spring 33. Meanwhile, during exposure, the sheet glass 28 and the original film 32 are brought into close contact with each other by virtue of the urging force of the resilient spring 33 and the weight of the sheet glass 28 and the Fresnel lens 29.

A resilient member 15 such as packing is disposed around a peripheral edge portion of the sheet glass 28 on the surface plate 13, and when the top cover portion 99 is swung down and covers the light-sensitive-material setting section 17, the peripheral edge portion of the sheet glass 28 is brought into close contact with the resilient member. Then, as air between the sheet glass 28 and the surface plate 13 is sucked by a suction pump or the like during exposure, the air-tightness therebetween is enhanced. As a result, a layer of air between the light-sensitive material 16 and a layer of air between the sheet glass 28 and the original film 32 are eliminated, and these members are brought into close contact with each other. At the same time, the air in a gap formed between the peripheral edge portions of the original film 32 and the light-sensitive material 16 and the inner wall of the resilient member 15 is evacuated.

FIG. 15 shows an example of exposing the light-sensitive material 16 of the negative type. The light-sensitive material 16 is placed on the surface plate 13, the Y plate, M plate, C plate, and BK plate of the original films 32 are consecutively replaced on the light-sensitive material 16, and the images on them are printed one by one onto the light-sensitive material 16 four times in total. In the case of exposing the light-sensitive material 16 of the positive type, the Y plate, M plate, and C plate are consecutively placed on the side close to the light-sensitive material 16 in a state in which the BK plate is superposed thereon, and printing is effected three times in total.

The microwave-powered light source 44 for emitting ultraviolet light is held by an unillustrated column above the Fresnel lens 29. The interference filter unit 49 is disposed in the vicinity of the microwave-powered light source 44 between the microwave-powered light source 44 and the Fresnel lens 29. This interference filter unit 49 is provided with the three interference filters 56A, 56B, and 56C for exposure with the corresponding original films 32, i.e., the Y plate, M plate, C plate, and BK plate, as well as the transparent glass 57.

The heat insulating filter 45 is disposed between the interference filter 56 and the light source 44 so as to prevent the temperature rise of the interference filter 56. In addition, the louver 64 is disposed on the microwave-powered light source 44 side of the interference filter 56 along the optical path of radiation. Thus, the arrangement provided is such that only the direct light emitted from the light-emitting point 48 of the microwave-powered light source 44 and the light made to enter the louver 64 in a direction substantially identical with that of the direct light in the light reflected by the reflecting plate 46 are made to pass through the louver 64.

As the microwave-powered light source 44 is disposed above the sheet glass 28, the position of the light source 44 can be moved freely in the vertical direction, so that exposure can be effected by enlarging or reducing an area of radiation in proportion to the size of the light-sensitive material 16. Consequently, a color proof can be made without being restricted by the sizes of the original films 32 and the light-sensitive material 16.

Eighth Embodiment

FIGS. 16 to 20 illustrate a color proof making apparatus 200 in accordance with an eighth embodiment of the present invention. It should be noted that those members or portions which are identical to those adopted in the first, sixth, and seventh embodiments will be denoted by the same reference numerals, and a description thereof will be omitted.

Figure 16:
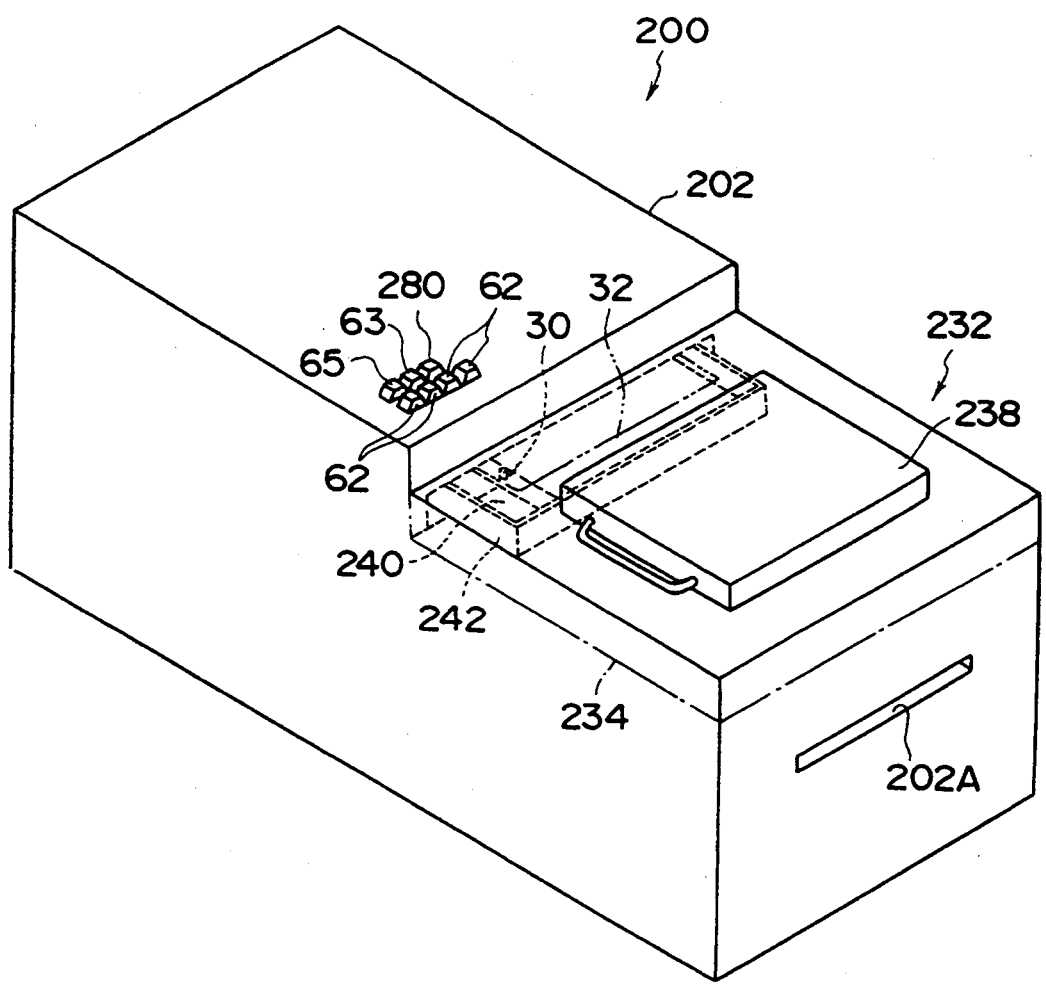
FIG. 16 is a perspective view of the color proof making apparatus in accordance with the seventh embodiment.
Figure 17:
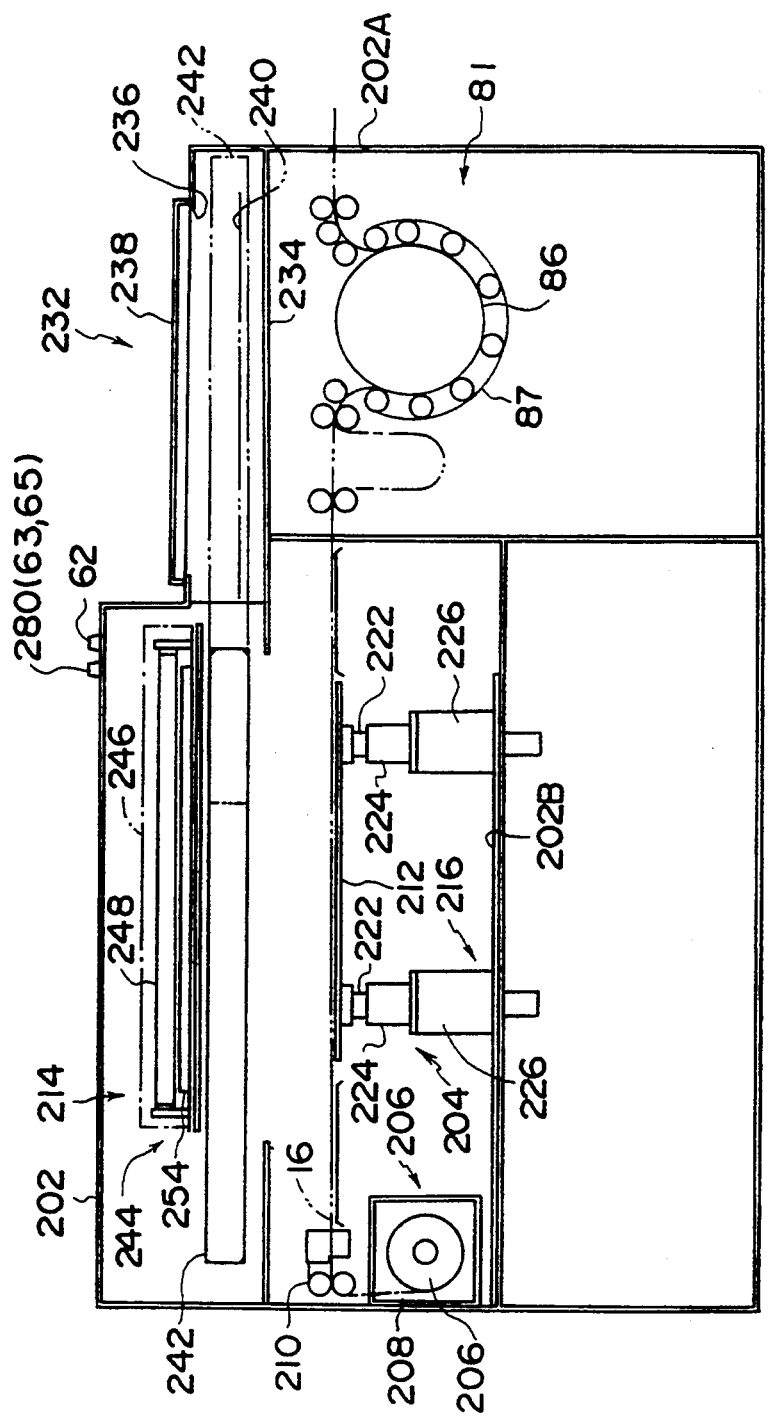
FIG. 17 is a schematic front view of the color proof making apparatus in accordance with the seventh embodiment.

As shown in FIG. 16, a casing 202 of the color proof making apparatus 200 has a substantially box-shaped configuration. As shown in FIG. 17, a surface plate section 204 is provided in a substantially central portion within the casing 202 of the color proof making apparatus 200. A magazine loading section 206 (left-hand side in FIG. 17) is disposed adjacent to the surface plate section 204. The heat development section 81 is provided on the side of the surface plate section 204 away from the magazine loading section 206.

A magazine 208 in which the elongated light-sensitive material 16 is accommodated in the form of a roll is loaded in the magazine loading section 206. The leading end of the light-sensitive material 16 is drawn out from the magazine 208, is transported substantially horizontally, passes through a cutter 210 disposed adjacent to the magazine loading section 206, and is transported to the surface plate section 204. The cutter 210 is adapted to cut the light-sensitive material 16 drawn out by a predetermined length.

The light-sensitive material 16 transported to the surface plate section 204 is placed on a surface plate 212, and an image recorded on the original film 32 is printed by an exposing section 214 disposed above the surface plate section 204. The imagewise exposed light-sensitive material 16 is then transported to the heat development section 81 disposed downstream of the surface plate section 204.

In the heat development section 81, the light-sensitive material 16 is heated and developed while the exposed light-sensitive material 16 is being transported by being wound around the heat roller 86. The light-sensitive material 16 developed in the heat development section 81 is then discharged through a discharge port 202A.

The surface plate section 204 is comprised of the surface plate 212 supported on an intermediate base of the color proof making apparatus 200 and a pair of drive units 216 for vertically moving this surface plate 212.

Figure 20:
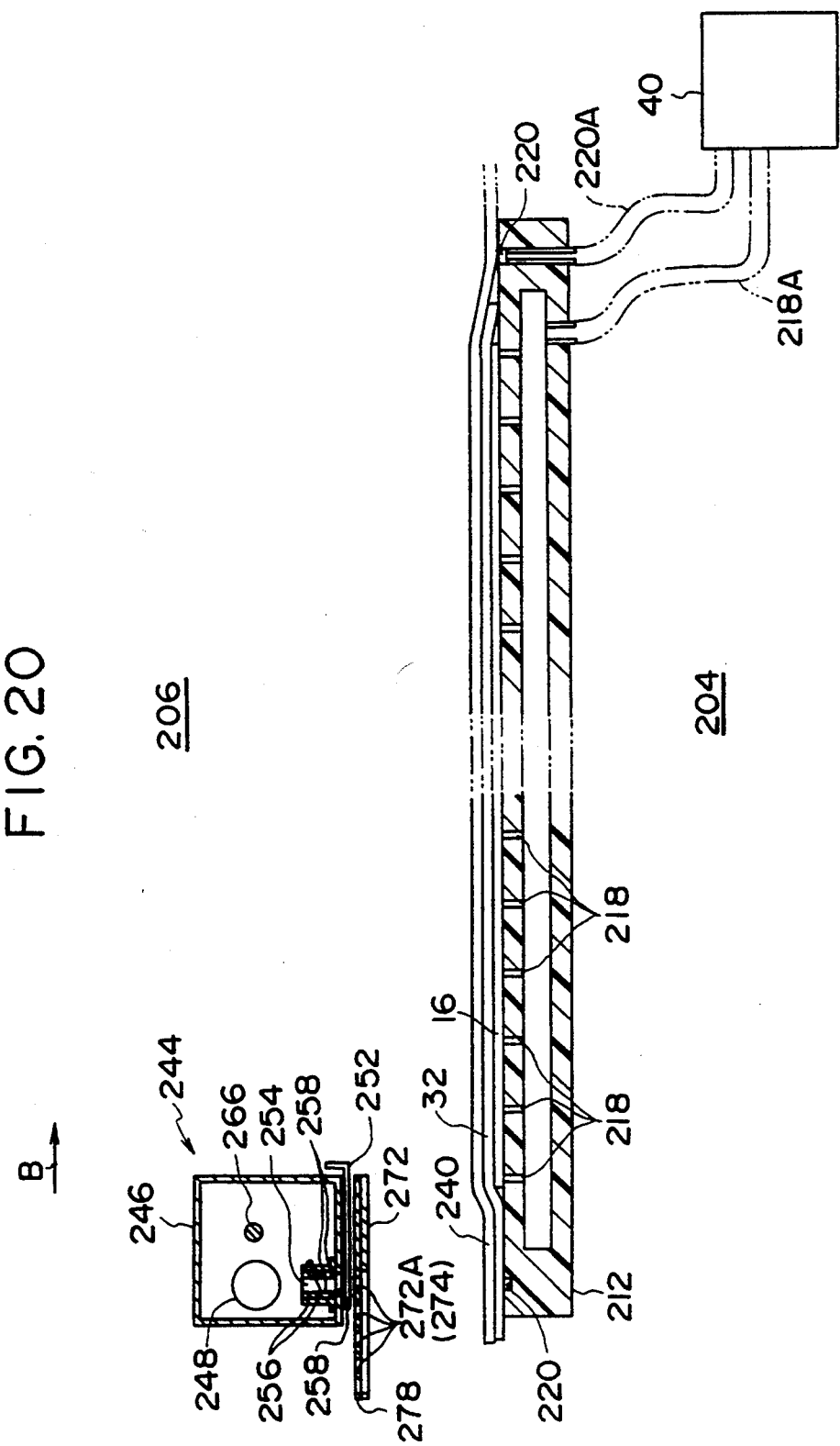
FIG. 20 is a cross-sectional view of an essential portion taken along the line 20—20 of FIG. 19.

As shown in FIG. 20, the interior of the surface plate 212 is made hollow, and the light-sensitive material 16 is placed on its upper surface. A plurality of holes 218 communicating with the interior of the surface plate 212 are formed in the upper surface of the surface plate 212, and grooves 220 are formed in the upper surface of the surface plate 212 in the vicinity of a peripheral edge thereof. The hollow portion of the surface plate 212 and the grooves 220 communicate with the suction pump 40 via tubes 218A and 220A, respectively, and negative pressure is supplied separately from the suction pump 40.

The light-sensitive material 16 transported to the surface plate section 204 is sucked and held by the upper surface of the surface plate 212 by means of negative pressure from the suction pump 40. In addition, an overlay sheet 240 (which will be described later) of a size larger than the light-sensitive material 16 and the original film 32 are sucked onto the grooves 220.

Figure 18:
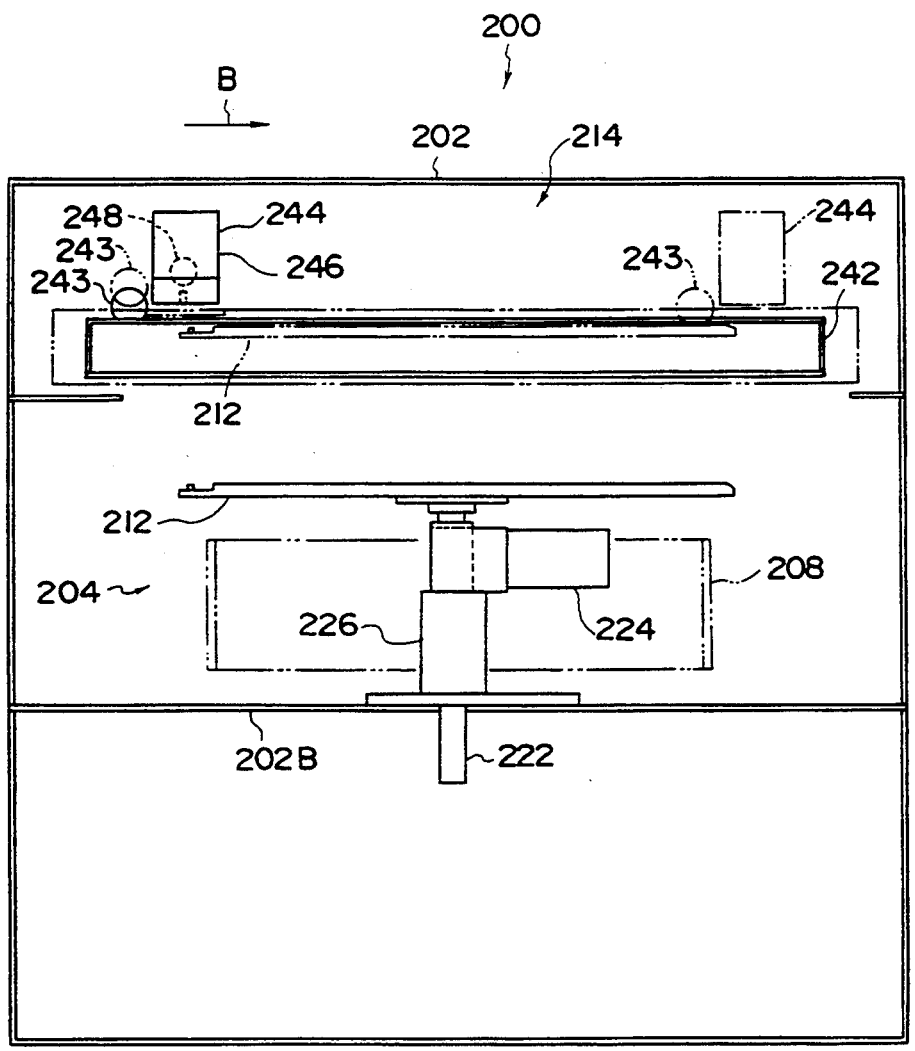
FIG. 18 is a schematic rear view of the color proof making apparatus in accordance with the seventh embodiment.
Figure 19:
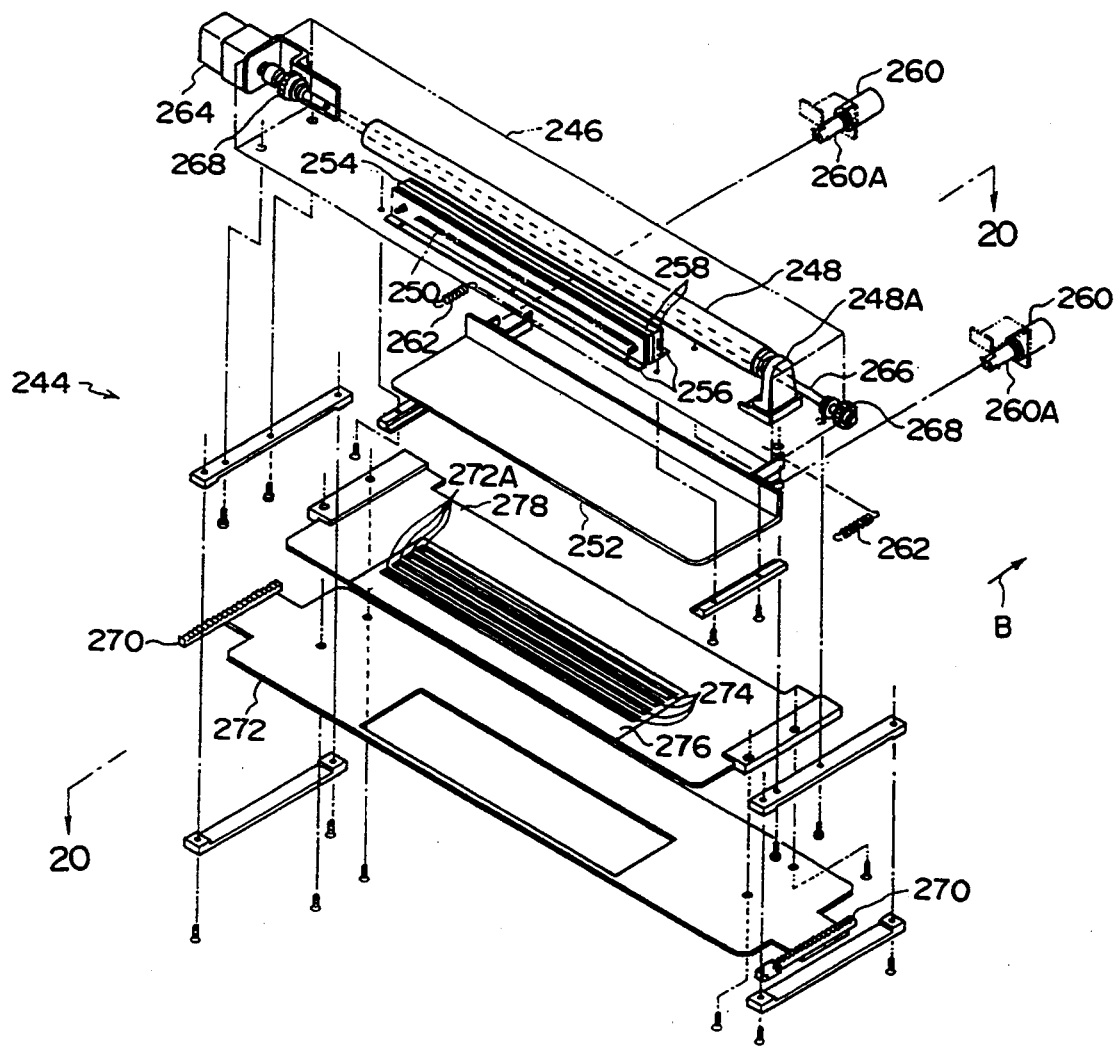
FIG. 19 is a perspective view of a light source section in accordance with the seventh embodiment.

As shown in FIGS. 17 and 18, the drive units 216 disposed below the surface plate 212 are adapted to move the surface plate 212 vertically to three positions, i.e., a lower-limit position (shown by the solid lines in FIG. 18) in which the light-sensitive material 16 is placed horizontally at a low position or is discharged to the heat development section 81, an upper-limit position (shown by two-dotted dash lines in FIG. 18) in which the surface plate 212 opposes the exposing section 214 at a high position and the exposing operation is effected, and an intermediate position located between the upper-limit position and the lower-limit position and used for standby when the original film 32 is replaced.

An axial end of a cylindrical rack 222 is connected to a lower surface of the surface plate 212. A toothed portion is formed in the longitudinal direction on an outer peripheral surface of the rack 222, and the other end of the cylindrical rack 222 projects downwardly of an intermediate base 202B. An intermediate portion of the rack 222 is inserted through a gear box 224 equipped with a motor and a pinion gear rotated by the motor, and the teeth of the rack 222 and the pinion gear mesh with each other (not shown). In addition, the gear box 224 is secured to the intermediate base 202B, and is operated as the unillustrated motor is driven, thereby allowing the pinion gear and the rack 222 to mesh with each other to vertically move the surface plate 212 in a horizontal state.

A sensor box 226 is disposed underneath the gear box 224. An intermediate portion of the rack 222 is inserted through the sensor box 226, and is adapted to detect one of a plurality of predetermined positions of the intermediate portion of the rack 222 as the surface plate 212 moves to its upper-limit position, intermediate position, and lower-limit position, so as to measure the position of the surface plate 212. Accordingly, the surface plate 212 is moved to its lower-limit position, upper-limit position, or intermediate position while its position is being detected accurately by the sensor box 226.

Meanwhile, as shown in FIGS. 16 and 17, the upper surface of the casing 202 is lowered by one stage above the heat development section 81, and a film loading section 232 is disposed therein. The film loading section 232 is partitioned from the heat development section 81 by means of a heat insulating plate 234, and a rectangular opening is formed in the upper surface thereof. This rectangular opening 236 is opened or closed by a cover 238. The cover 238 is attached to the casing 202 by means of unillustrated hinges, and is swung open from this side, as viewed in FIG. 17, toward the rear side, and is closed as it is swung in the opposite direction. This cover 238 is opened when the original film 32 is loaded in or removed from the film loading section 232 through the rectangular opening 236.

A support frame 242 of a rectangular frame-like configuration, by which the overlay sheet 240 for initially placing the original film 32 thereon is held, is disposed in the film loading section 232. The support frame 242 is capable of reciprocating between the film loading section 232 and the original film 32. An opening of this support frame 242 is made larger than the original film 32, and positioning pins 30 for positioning the original film 32 with respect to the support frame 242 are disposed upright on one side of the support frame 242 (one is shown in FIG. 16).

The overlay sheet 240 disposed in the support frame 242 has a size sufficient for covering the opening of the support frame 242, and is adapted to be moved in a circulating manner between the upper surface and the lower surface of the support frame 242 by means of a driving means (not shown). As this driving means (not shown), it is possible to adopt, for instance, the following arrangement.

A rectangular opening of a size sufficient to allow the overlay sheet 240 to pass therethrough is formed in the side of the support frame 242 opposing the side where the positioning pins 30 are located. A pair of pulleys are arranged horizontally in this rectangular opening at positions corresponding to the transverse opposite ends of the overlay sheet 240. In correspondence with this pair of pulleys, another pair of pulleys are disposed horizontally on the side of the support frame 242 where the positioning pins 30 are located. The latter pair of pulleys are secured to a rotating shaft coupled with a reversible motor. Endless belts are wound around and trained between corresponding ones of the two pairs of pulleys, and the overlay sheet 240 is retained at transverse opposite sides thereof by the endless belts. As a result, as the motor is rotated forwardly or reversely, the overlay sheet 240 thus retained moves round the pulleys in the circulating manner, moving from the upper surface side to the lower surface side of the support frame 242 or vice versa.

Accordingly, when the support frame 242 is moved horizontally to the film loading section 232 to effect a film loading operation, the overlay sheet 240 is positioned on the lower surface side of the support frame 242 and supports the overall surface of the original film 32 loaded in the support frame 242. Subsequently, when the support frame 242 is moved horizontally to the surface plate section 204, the overlay sheet 240 is moved in the circulating manner to the upper surface side of the support frame 242 and covers the upper surface of the original film 32.

That is, at a time when the original film 32 is loaded, in a state in which the support frame 242 is located in the film loading section 232, the original film 32 with its upper surface facing down is placed on the overlay sheet 240 positioned on the lower surface side of the support frame 242, and the original film 32 is positioned by means of the positioning pins 30. In this state, the support frame 242 is moved horizontally to above the surface plate section 204.

At this time, the surface plate 212 raised to its intermediate position is located below the support frame 242 which has been moved horizontally to above the surface plate section 204. In this state, as the overlay sheet 240 carrying the original film 32 thereon is moved in the circulating manner until it is inverted, i.e., placed over the original film 32. The light-sensitive material 16, the original film 32, and the overlay sheet 240 are arranged in that order on and above the surface plate 212. Subsequently, the surface plate 212 is raised to the exposure position at its upper limit.

In this embodiment as well, when the light-sensitive material 16 of the negative type is exposed, the Y plate, M plate, C plate, and BK plate of the original films 32 are consecutively replaced in the support frame 242 and the images on them are printed one by one onto the light-sensitive material 16 four times in total. When the light-sensitive material 16 of the positive type is exposed, at a time when each of the original films including the Y plate, M plate, and C plate is loaded in the support frame 242, the BK plate is superposed on each of these original films, and the images on them are consecutively printed three times in total. It should be noted that the original films 32 are provided with identification marks making it possible to discriminate between the Y plate, M plate, C plate, and BK plate, so that a desired one of the original films 32 can be selected easily.

As shown in FIG. 18, a squeeze roller 243 is provided in the exposing section 214 disposed above the surface plate section 204. The squeeze roller 243 is adapted to reciprocate in the transverse direction of the light-sensitive material 16 in the direction of arrow B in FIG. 18 and in the opposite direction thereto as the squeeze roller 243 is driven by an unillustrated driving means. In addition, the squeeze roller 243 when moving in the direction of arrow B is adapted to rotate and move on the surface plate 212 by its own weight, with the result that the light-sensitive material 16, the original film 32, and the overlay sheet 240 which are placed on the surface plate 212 are squeezed and are brought into close contact with each other.

As shown in FIGS. 17 and 18, the exposing section 214 is provided with a light source section 244. In the light source section 244, a fluorescent lamp 248 serving as a light source for emitting ultraviolet light is disposed in a casing 246 in such a manner as to extend between a pair of fluorescent lamp sockets 248A secured on lower end surfaces of the casing 246. A slit 250 oriented along the longitudinal direction of the fluorescent lamp 248 is formed in a lower end surface of the casing 246 opposed to the surface plate 212. An openable shutter 252 is attached underneath the casing 246 in correspondence with the slit 250. Above the slit 250, a SELFOC lens 254 serving as an optical means is pressure-fit and secured between brackets 256 by means of a resin plate 258. This SELFOC lens is adapted to collimate the ultraviolet light emitted from the fluorescent lamp 248 into parallel rays in a direction perpendicular to the axial direction of the fluorescent lamp 248 (i.e., vertically in FIG. 19).

The openable shutter 252 is connected to a drive shaft 260A of a solenoid 260, and is moved in the transverse direction of the slit 250 (in the direction of arrow B in FIG. 19) by being driven by the solenoid 260. The openable shutter 252 is provided with a compression coil spring 262, and when the driving by the solenoid is stopped, the openable shutter 252 is moved in a direction opposite to that of arrow B in FIG. 19 by the urging force of the compression coil spring 262. As a result, the slit 250 is opened and closed by the openable shutter 252.

A stepping motor 264 is attached to one side surface of the casing 246. This stepping motor 264 has a drive shaft 266 penetrating the opposing side surfaces of the casing 246, and a pair of gears 268 are mounted on opposite ends of that drive shaft 266 projecting outwardly of the respective side surfaces. In addition, a filter supporting plate 272, which is provided with a pair of racks 270 opposed to the respective gears 268, is disposed below the casing 246, and the respective gears 268 are opposed to the toothed portions of the racks 270 and mesh with the same, respectively. Accordingly, as the stepping motor 264 is driven, the gears 268 and the racks 270 are meshed with each other, thereby allowing the filter supporting plate 272 to be moved along the transverse direction of the slit 250 relative to the same.

The filter supporting plate 272 is provided with a filter sheet 276 in which four filters 274 are attached to four slits 272A, respectively. Longitudinally opposite ends of the filter sheet 276 are secured to a plate 278 secured to an upper surface of the filter supporting plate 272.

In this embodiment, yellow (Y), magenta (M), cyan (C), and transparent (BK) filters of four colors are arranged as the filters 274 in the form of strips along the slits 272A. As the stepping motor 264 is driven, one of these filters 274 is moved to oppose the slit 250 in the casing 246.

The stepping motor 264 is driven in correspondence with the type of original film 32 loaded in the support frame 242, and an appropriate filter 274 corresponding to that original film 32 is selected. That is, control is effected such that if the original film 32 is the yellow (Y) plate, the Y filter is moved to oppose the slit 250 in the casing 246; if the original film 32 is the magenta (M) plate, the M filter is moved to oppose the slit 250; and if the original film 32 is the cyan (C) plate, the C filter is moved to oppose the slit 250.

As shown in FIG. 16, the filter selection buttons 62, the exposure start button 63, and the exposure stop button 65 are provided on the upper surface of the casing 202. The exposure filter corresponding to the original film 32 is selected by pressing the filter selection button 62. Pressing the exposure start button 63 after loading the original film 32 in the film loading section 232 causes the support frame 242 to move to above the surface plate 212, and exposure is started. Subsequently, after completion of a predetermined cycles of exposure, if the exposure stop button is pressed, the light-sensitive material 16 on the surface plate 212 is transported to the heat development section 81. A light-sensitive-material setting button 280 for transporting the light-sensitive material 16 onto the surface plate 212 is provided on the upper surface of the casing 202 in juxtaposition with the various switchbuttons. Pressing this light-sensitive-material setting button 280 causes the light-sensitive material 16 to be drawn out from the magazine 208, and is sucked and held by the surface plate 212.

A reservoir section is disposed between the surface plate section 204 and the heat development section 81. The reservoir section is adapted to absorb a difference between the traveling speed of the light-sensitive material 16 being discharged from the surface plate section 204 and the traveling speed thereof in the heat development section 81.

Referring now to a flowchart shown in FIG. 21, a description will be given of the operation of this embodiment.

When the unillustrated power switch of the color proof making apparatus 200 is turned on, the temperature of the heat roller 86 in the heat development section 81 reaches a level at which the light-sensitive material 16 can be developed. At the same time, the suction pump 40 is set in a state in which it is capable of supplying negative pressure to the surface plate 212.

First, in Step 170, when the light-sensitive-material setting button 280 is pressed, the light-sensitive material 16 is drawn out from the magazine 208, is cut to a predetermined length by the cutter 210, and is then transported to the surface plate section 204. When the light-sensitive material 16 is transported to the surface plate section 204, and is placed on the surface plate 212, negative pressure is supplied to the hollow portion of the surface plate 212 from the suction pump 40, thereby allowing the light-sensitive material 16 to be sucked and held by the surface plate 212. Subsequently, the surface plate 212 is raised to the intermediate standby position (Step 172).

In an ensuing Step 174, an appropriate filter 274 is selected among the Y, M, C, and BK (transparent) filters by the filter selection button 62 in correspondence with the original film 32. As a result, the stepping motor 264 is driven and the filter 274 thus selected is moved to oppose the slit 250 in the light source section 244. At the same time, the exposure amount Pi (i corresponds to any one of the Y, M, C, and BK plates) corresponding to the filter 274 is read (Step 176).

Subsequently, the operator opens the cover 238 of the film loading section 232 and loads the original film 32 (Step 178). Specifically, the original film 32 is placed on the overlay sheet 240 positioned on the lower surface side of the support frame 242, and is fitted over the positioning pins 30 through the positioning holes formed therein, so as to effect positioning with respect to the support frame 242.

If it is determined in Step 180 that the exposure start button 63 has been pressed, the original film 32 is set onto the surface plate 212 (Step 182). Specifically, the support frame 242 is moved horizontally to above the surface plate section 204, and when the original film 32 is located at the exposure position, the overlay sheet 240 carrying the original film 32 thereon is moved in a circulating manner in such a way as to be inverted and cover the original film 32. As a result, the light-sensitive material 16, the original film 32, and the overlay film are arranged in that order on the surface plate 212. Negative pressure is then supplied from the suction pump 40 to the grooves 220 in the surface plate 212, and both the original film 32 and the overlay sheet 240 is sucked onto the surface plate 212. Subsequently, the surface plate 212 is raised to the exposure position at its upper limit.

In an ensuing Step 184, the squeeze roller 243 is driven to cause the overlay sheet 240, the original film 32, and the light-sensitive material 16 be brought into close contact with each other. At this time, the light source section 244 is also moved as the squeeze roller 243 is moved.

Exposure is effected in Steps 150 through 158. In exposure, after the fluorescent lamp 248 in the light source section is turned on, the solenoid 260 is driven to move the openable shutter 252 so as to open the slit 250, and the movement of the light source section 244 is started. When the light source section 244 has moved to a predetermined position, the openable shutter 252 is closed, thereby completing exposure. At this time, as for the traveling speed of the light source section 244, the state of exposure of the light-sensitive material 16 is controlled in response to the exposure amount Pi based on the filter 274.

The ultraviolet light emitted from the fluorescent lamp 248 in the light source section 244 has a wavelength corresponding to the light-sensitive wavelength region (C=400–435 nm, M=365–400 nm, and Y=3-30–365 nm) of the light-sensitive material 16. The ultraviolet light emitted from this fluorescent lamp 248 is converted to parallel rays of light by means of the SELFOC lens 254 and is transmitted uniformly along the longitudinal direction of the fluorescent lamp 248. These parallel rays of ultraviolet light pass through the slit 250, and are applied to the filter 274 opposing the slit 250. Since each filter 274 is used in correspondence with the type of original film 32, the Y filter is opposed when the Y plate original film 32 is loaded, and only the ultraviolet light having a wavelength region of 400–435 nm is allowed to pass therethrough and is applied to the light-sensitive material 16. Since the fluorescent lamp 248, the slit 250, and the filter 274 are disposed along the longitudinal direction of the light-sensitive material 16, the exposure of the light-sensitive material 16 in the longitudinal direction is effected en bloc by means of the ultraviolet light emitted from the fluorescent lamp 248. In addition, as the light source section 244 is moved along the transverse direction of the light-sensitive material 16, the exposure scanning of the light-sensitive material 16 along the transverse direction thereof is effected.

Since the filters 274 of colors corresponding to the respective original films 32 are selectively moved and are made to oppose the slit 250, the filters 274 are not constantly subjected to heat from the light source. In addition, since the fluorescent lamp 248 which generates a small amount of heat as compared with a point source is used, the filters 274 remains practically unaffected by the heat from the light source.

Upon completion of exposure, in Step 186, the supply of negative pressure from the suction pump to the grooves 220 in the surface plate 212 is canceled, thereby canceling the suction of the original film 32 and the overlay sheet 240. Furthermore, the surface plate 212 is lowered to its intermediate position by being driven by the drive units 216.

Subsequently, the overlay sheet 240 is moved in a circulating manner so as to be located beneath the original film 32, the original 32 is thus supported on the overlay sheet 240, and in this state the support frame 242 is moved horizontally to the film loading section 232.

In the color proof making apparatus 200, the original films 32 are consecutively replaced and superposed one at a time on the light-sensitive material 16, and exposure is effected a predetermined number of times. When the exposure of the light-sensitive material 16 by using the final original film 32 is completed, and the exposure end button 65 is pressed (Step 188), the surface plate 212 is lowered to its lower-limit position, and the supply of negative pressure by the suction pump 40 is canceled. When the suction of the light-sensitive material 16 onto the surface plate 212 is canceled, the light-sensitive material 16 is transported to the heat development section 81 so as undergo heat development (Steps 190 and 192).

Although, in this embodiment, the ultraviolet light-sensitive region of the light-sensitive material 16 is covered by one fluorescent lamp 248, the light source section 244 may be provided with a plurality of fluorescent lamps 248. In that case, the fluorescent lamps 248 may respectively cover different ultraviolet light-sensitive regions, in which case if the fluorescent lamps 248 are consecutively moved to oppose the slit 250, it is possible to apply ultraviolet light of specific wavelength regions to the light-sensitive material 16.

Although, in this embodiment, the light source section 244 is moved, and the images recorded on the original films 32 are printed onto the light-sensitive material 16, the light source section 244 may not be moved, and the original film 32 and the light-sensitive material 16 may be moved instead.

Figure 22A:
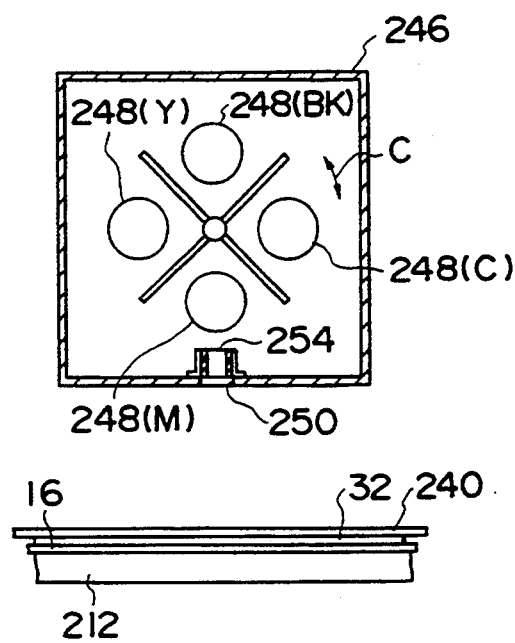
FIGS. 22A and 22B are cross-sectional views of essential portions and illustrate modifications of the light source.

It should be noted the light source section may be comprised of a plurality of light sources or a combination of a plurality of light sources and filters. For instance, an arrangement may be provided such that, as shown in FIG. 22A, a plurality of fluorescent lamps 248 (Y), 248(M), 248(C), and 248(BK) are provided in correspondence with the light-sensitive wavelength region of the light-sensitive material 16. When specific ultraviolet light is selected, these fluorescent lamps 248 (Y), 248(M), 248(C), and 248(BK) may be rotated in the direction of the double-headed arrow C. In this case, the filters 274 are not required.

Figure 22B:
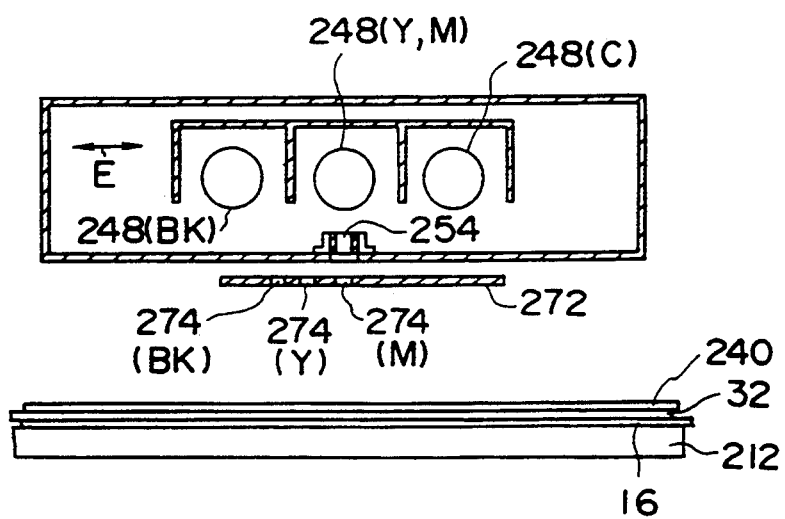

In addition, an arrangement may be alternatively provided as shown in FIG. 22B. In this arrangement, the following are provided as light sources: the fluorescent lamp 248(BK) for emitting ultraviolet light of substantially the entire region, a fluorescent lamp 248(Y, M) for exposing the light-sensitive material 16 via the original films 32 of the Y and M plates, and the fluorescent lamp 248(C) for exposing the light-sensitive material 16 via the original film 32 of the C plate. In addition, the following are provided as the filters: a transparent filter 274(BK) corresponding to the BK plate, a filter 274(Y) corresponding to the Y plate, and a filter 274(M) corresponding to the M plate. When the light-sensitive material 16 is exposed, the fluorescent lamps 248 and the filters 274 are respectively driven in the direction of the double-headed arrow E to fetch the ultraviolet light of specific light-sensitive wavelength regions. When the original film 32 of the C plate is exposed, exposure is effected by means of the fluorescent lamp 248(C) and the filter 274(BK).

It should be noted that in the light source section shown in FIGS. 22A and 22B, when the light-sensitive material 16 of the positive type is exposed, the fluorescent lamp 248(BK) is not required.

In addition, although, in this embodiment, the SELFOC lens 254 is used as the optical means, the optical means is not restricted to the same, and an arrangement in which only the slit oriented in the longitudinal direction of the fluorescent lamp 248 is formed. Alternatively, an arrangement in which a grid or a louver is disposed is applicable. Preferably, however, such members should be arranged in such a manner that the ultraviolet light converted to parallel rays of light is applied toward the light-sensitive material 16, and these parallel rays of light are applied to the light-sensitive material 16 perpendicularly to the light-sensitive surface thereof.

What is claimed is:

1. A color proof making apparatus for making a color proof for forming a color image by exposing an ultraviolet light-sensitive material to light of an ultraviolet wavelength region through an image original, and by heating the exposed ultraviolet light-sensitive material, comprising:
   a light source for emitting the light of the ultraviolet wavelength region;
   an interference filter disposed between the light source and the image original; and
   light-quantity integrating means for detecting the quantity of light emitted from the light source and for determining whether an exposure amount associated with the emitted light has reached a predetermined value, said integrating means being disposed in such a manner that at least a light-receiving portion thereof is located in an optical path between the interference filter and the light source.

2. A color proof making apparatus according to claim 1, wherein the light-quantity integrating means includes a light transmitting cable having an end portion constituting the light-receiving portion and another end portion located outside the optical path and constituting a light-fetching portion, and a light-quantity integrating meter for integrating the quantity of light from the light source by receiving the light from the light-fetching portion.

3. A color proof making apparatus according to claim 1, wherein the light-quantity integrating means includes light reflecting means constituting the light-receiving portion and adapted to reflect part of the light from the light source to outside the optical path, and a light-quantity integrating meter for integrating the quantity of light from the light source by receiving the light reflected from the light reflecting means.

4. A color proof making apparatus, comprising:
   an exposing section having a light source for exposing a light-sensitive material by radiating light to the light-sensitive material via an image original superposed on the light-sensitive material;
   a cover for covering the exposing section from the light-sensitive material side; and
   sucking means for sucking the light-sensitive material against an underside of the cover.

5. A color proof making apparatus according to claim 4, wherein the light source emits ultraviolet light, and the light-sensitive material is an ultraviolet-light-sensitive heat-developable material.

6. A color proof making apparatus according to claim 4, further comprising:
   relative-position maintaining means for maintaining a relative positional relationship between the cover and the exposing section to a fixed distance.

7. A color proof making apparatus for making a color proof for forming a color image having a dye image by exposing an ultraviolet light-sensitive material to light of an ultraviolet wavelength region through an image original, and by heating the exposed material, comprising:
   a light source for radiating the light of the ultraviolet wavelength region to the image original; and
   a filter unit in which a plurality of filters are disposed in correspondence with mutually different light-sensitive wavelength regions of the light-sensitive material, the plurality of filters being capable of respectively transmitting therethrough the light of corresponding ultraviolet wavelength regions for exposing the light-sensitive material sensitive to the ultraviolet wavelength regions, and the plurality of filters being capable of being moved into or away from an optical path between the light source and the image original.

8. A color proof making apparatus according to claim 7, wherein the filter unit further has a light-reducing filter for reducing a quantity of light emitted from the light source and applied to the image original.

9. A color proof making apparatus for making a color proof for forming a color image having a dye image by exposing an ultraviolet light-sensitive material to ultraviolet light of an ultraviolet wavelength region through an image original, and by heating the exposed material, comprising:
   a light source for radiating the ultraviolet light;
   a plurality of filters disposed in correspondence with the ultraviolet light of mutually different light-sensitive wavelength regions in the ultraviolet light, the plurality of filters being capable of respectively transmitting therethrough the ultraviolet light of corresponding ultraviolet wavelength regions;
   selecting means for selecting one filter from the plurality of filters in correspondence with an identification code provided on the image original for specifying a type of the image original; and
   filter driving means for inserting the filter selected by the selecting means into an optical path between the light source and the light-sensitive material.

10. A color proof making apparatus according to claim 9, further comprising:
    control means for controlling a quantity of light radiated to the light-sensitive material via the image original in correspondence with a specified type of the image original.

11. A color proof making apparatus according to claim 9, wherein the plurality of filters are interference filters.

12. A color proof making apparatus according to claim 9, further comprising:
    detecting means for detecting the identification code; and
    control means for controlling the selecting means so as to select the filter on the basis of a detection signal outputted from the detecting means, and for controlling the filter driving means in such a manner that the filter is inserted into the optical path between the light source and the light-sensitive material.

13. A color proof making apparatus according to claim 9, further comprising:
    optical means for converting the ultraviolet light from the light source to parallel rays of light and disposed between the light source and the image original.

14. A color proof making apparatus according to claim 13, wherein the optical means is a Fresnel lens.

15. A color proof making apparatus for making a color proof for forming a color image having a dye image by exposing an ultraviolet light-sensitive material to ultraviolet light through an image original, and by heating the exposed material, comprising:
    a microwave-powered light source for emitting the ultraviolet light;
    at least three filters disposed in correspondence with at least three different light-sensitive wavelength regions of the light-sensitive material, the filters being capable of respectively transmitting therethrough the ultraviolet light of corresponding ultraviolet wavelength regions for exposing the light-sensitive material sensitive to the ultraviolet wavelength regions, and the filters being capable of being inserted into an optical path between the microwave-powered light source and the image original;

at least one heat insulating filter disposed in such a manner as to be located in the optical path between the microwave-powered light source and a position where the filters are inserted; and control means for effecting control such that the light-sensitive material is exposed by the microwave-powered light source by consecutively inserting the filters into the optical path.

16. A color proof making apparatus according to claim 15, wherein the filters are interference filters.

17. A color proof making apparatus according to claim 15, wherein the microwave-powered light source is located below the image original.

18. A color proof making apparatus according to claim 15, wherein the microwave-powered light source is located above the image original.

19. A color proof making apparatus for making a color proof for forming a color image having a dye image by exposing an ultraviolet light-sensitive material to ultraviolet light through an image original, and by heating the exposed material, comprising:

at least three light sources disposed in correspondence with at least three different light-sensitive wavelength regions of the light-sensitive material, the light sources being respectively adapted to emit the ultraviolet light-sensitive of corresponding ultraviolet wavelength regions for exposing the light-sensitive material sensitive to the ultraviolet wavelength regions; and control means for effecting control such that the at least three light sources are turned on separately or simultaneously to expose the light-sensitive material.

20. A color proof making apparatus according to claim 19, wherein the at least three light sources are located below the image original.

21. A color proof making apparatus according to claim 19, wherein the at least three light sources are located above the image original.

22. A color proof making apparatus for making a color proof for forming a color image having a dye image by exposing an ultraviolet light-sensitive material to ultraviolet light through an image original, and by heating the exposed material, comprising:

a linear light source for radiating the ultraviolet light to the light-sensitive material;

moving means for causing the light-sensitive material and the image original on the one hand, and the light source on the other, to move relative to each other;

optical means for converting the ultraviolet light from the light source to parallel rays of light; and selecting means for selecting the ultraviolet light of an ultraviolet wavelength region radiated from the light source and corresponding to the image original.

23. A color proof making apparatus according to claim 22, wherein the ultraviolet selecting means includes a filter disposed selectively between the image original and the light source and adapted to allow the ultraviolet light of the ultraviolet region corresponding to the image original to be transmitted therethrough.

24. A color proof making apparatus according to claim 22, wherein the light source is located below the image original.

25. A color proof making apparatus according to claim 22, wherein the source is located above the image original.

* * * * *